United States Patent
Yoshino et al.

(10) Patent No.: US 8,999,502 B2
(45) Date of Patent: Apr. 7, 2015

(54) COVER TAPE, METHOD FOR MANUFACTURING COVER TAPE, AND ELECTRONIC PART PACKAGE

(75) Inventors: Masayuki Yoshino, Tokyo (JP); Toshihiro Koyano, Tokyo (JP); Daisuke Masaki, Tokyo (JP); Yutaka Matsuki, Tokyo (JP)

(73) Assignee: Asahi Kasei Chemicals Corporation, Tokyo (JP)

( * ) Notice: Subject to any disclaimer, the term of this patent is extended or adjusted under 35 U.S.C. 154(b) by 0 days.

(21) Appl. No.: 13/386,077

(22) PCT Filed: Aug. 25, 2010

(86) PCT No.: PCT/JP2010/064388
§ 371 (c)(1),
(2), (4) Date: Jan. 20, 2012

(87) PCT Pub. No.: WO2011/024860
PCT Pub. Date: Mar. 3, 2011

(65) Prior Publication Data
US 2012/0276377 A1 Nov. 1, 2012

(30) Foreign Application Priority Data

Aug. 31, 2009 (JP) ................. 2009-199529
Feb. 9, 2010 (JP) ................. 2010-026512
Jun. 29, 2010 (JP) ................. 2010-147940

(51) Int. Cl.
*B32B 7/12* (2006.01)
*B32B 27/00* (2006.01)
*B29C 55/00* (2006.01)
*C09J 7/02* (2006.01)
*H01L 21/683* (2006.01)

(52) U.S. Cl.
CPC .......... *C09J 7/0271* (2013.01); *C09J 2203/326* (2013.01); *H01L 21/6835* (2013.01); *H01L 2924/00013* (2013.01)

(58) Field of Classification Search
None
See application file for complete search history.

(56) References Cited

U.S. PATENT DOCUMENTS

| | | | | | |
|---|---|---|---|---|---|
| 3,631,899 | A | * | 1/1972 | Erickson | 138/171 |
| 3,718,495 | A | * | 2/1973 | Tomita | 428/355 AK |
| 4,487,994 | A | * | 12/1984 | Bahder | 174/73.1 |
| 4,596,732 | A | * | 6/1986 | Diaz | 428/181 |
| 5,177,143 | A | * | 1/1993 | Chang et al. | 524/848 |
| 5,460,878 | A | * | 10/1995 | Hostetter | 428/349 |

(Continued)

FOREIGN PATENT DOCUMENTS

| EP | 143457 A2 * | 6/1985 |
|---|---|---|
| EP | 1 491 575 | 12/2004 |

(Continued)

OTHER PUBLICATIONS

Naraoka, H., Carrier Tape, Top Cover Tape, and Packing Method for Electronic Component, Jul. 19, 2007, machine translation of JP2007-182244A.*

(Continued)

*Primary Examiner* — Alicia Chevalier
*Assistant Examiner* — Chinessa Adkins
(74) *Attorney, Agent, or Firm* — Greenblum & Bernstein, P.L.C.

(57) ABSTRACT

A cover tape having a temperature at which a heat shrinkage rate in at least one of a machine direction and a transverse direction perpendicular to the machine direction is 5% or more between 80° C. to 200° C.

7 Claims, 4 Drawing Sheets

(56) References Cited

U.S. PATENT DOCUMENTS

| | | | |
|---|---|---|---|
| 5,904,964 A | 5/1999 | Snyder | |
| 7,175,893 B2 * | 2/2007 | Coats et al. | 428/34.9 |
| 2009/0017245 A1 | 1/2009 | Forloni | |

FOREIGN PATENT DOCUMENTS

| | | | |
|---|---|---|---|
| JP | S53-066476 | | 6/1978 |
| JP | S54-053092 | | 4/1979 |
| JP | S55-48234 | | 4/1980 |
| JP | H3-189147 | | 8/1991 |
| JP | H5-220909 | | 8/1993 |
| JP | H10-053225 | | 2/1998 |
| JP | 2005-119282 | | 5/2005 |
| JP | 2005-329678 | | 12/2005 |
| JP | 2006-312489 | | 11/2006 |
| JP | 2007-182244 | | 7/2007 |
| JP | 2007182244 A | * | 7/2007 |
| JP | 2009-019063 | | 1/2009 |
| JP | 2009-191187 | | 8/2009 |
| JP | 2010-076832 | | 4/2010 |
| KR | 1982-0002058 | | 10/1982 |
| TW | 200835603 | | 9/2008 |

OTHER PUBLICATIONS

Search report from International Application No. PCT/JP2010/064388 (English version), mail date is Oct. 12, 2010.

English translation of International Report Preliminary Report on Patentability for International Application No. PCT/JP2010/064388, mail date is Mar. 22, 2012.

Office Action dated Jun. 4, 2013 from TW patent application No. 099129332.

Japanese Official Action dated Oct. 1, 2013 from counterpart Japanese patent application No. P2010-026512.

Japanese Official Action dated Oct. 8, 2013 from counterpart Japanese patent application No. P2010-147940.

Russian Office Action dated Aug. 7, 2013 from counterpart Russian patent application No. 2012112480.

Office Action from KR patent application 10-2012-7002237 mailed Apr. 19, 2013.

Supplementary European Search Report in counterpart application No. 10811909.0, mail date is Oct. 31, 2013.

Japan Office Action in counterpart application No. P2009-199529, mail date is Oct. 8, 2013.

\* cited by examiner (a)

(b)

(c)

(d)

COVER TAPE, METHOD FOR MANUFACTURING COVER TAPE, AND ELECTRONIC PART PACKAGE

TECHNICAL FIELD

The present invention relates to a cover tape, a method for manufacturing the cover tape, and an electronic part package.

BACKGROUND ART

Conventionally, as a method for transporting electronic parts, a taping reel method of transporting an electronic part in a state in which it is sealed in a wrapping material has been known. In the taping reel method, an electronic part is inserted into a carrier tape provided with electronic part accommodating pockets at a constant interval in the length direction of the tape, then sealing the electronic part by heat sealing the cover tape from the upper section, winding up the tape in a reel shape, storing and transporting the electronic part.

A wrapped product wound up in a reel shape is transported to a mounter manufacturer where the cover tape is peeled of from the carrier tape, the accommodated electronic part is adsorbed by using an air adsorption nozzle, and then mounted on a circuit board in a step for producing, for example, a circuit board.

As a cover tape to be used as a wrapping material for an electronic part, for example, Patent Literature 1 describes a cover tape for wrapping an electronic part in which a biaxially stretched film such as polyester, polypropylene and nylon is used as a base material layer. Furthermore, Patent Literature 2 discloses a cover tape including a base material layer, an intermediate layer and a sealant layer, in which the intermediate layer has a predetermined heat shrinkage property and the base material layer and the intermediate layer have a predetermined thickness.

CITATION LIST

Patent Literature

[Patent Literature 1] Japanese Unexamined Patent Application Publication No. 2006-312489
[Patent Literature 2] Japanese Unexamined Patent Application Publication No. 2010-76832

SUMMARY OF INVENTION

Technical Problem

However, a problem is that when a cover tape for wrapping an electronic part described in Patent Literature 1 is heat-sealed to a carrier tape, the cover tape slackens.

Furthermore, a cover tape described in Patent Literature 2 uses an intermediate layer having a predetermined heat shrinkage property, and allows a base material layer and an intermediate layer to have a predetermined thickness, and thereby, slack of the cover tape after heat sealing is intended to be reduced. However, also in the cover tape described in Patent Literature 2, slack generated after heat sealing has not been reduced sufficiently.

The present invention has been made in view of the above-mentioned circumstances, and an object thereof is to provide a cover tape capable of sufficiently reducing slack generated after it is heat sealed to the carrier tape. Another object of the present invention is to provide a method for manufacturing the cover tape and an electronic part package using the cover tape.

Solution to Problem

That is to say, the present invention provides a cover tape having a temperature at which a heat shrinkage rate in at least one of the machine direction (hereinafter, sometimes referred to as "MD") and the transverse direction (hereinafter, sometimes referred to as "TD") perpendicular to the machine direction is 5% or more between 80° C. to 200° C.

The present invention also provides a cover tape having a temperature at which heat shrinkage rates in both a machine direction and a transverse direction perpendicular to the machine direction are 5% or more between 80° C. to 200° C.

With the above-mentioned configuration, the cover tape according to the present invention can sufficiently reduce slack after heat sealing, which has been generated in a conventional cover tape. That is to say, the cover tape according to the present invention enables tight taping free from slack even after it is heat sealed to a carrier tape.

It is preferable that the cover tape according to the present invention have a temperature $T_1$ and a temperature $T_2$ satisfying the following formulae (i), (ii) and (iii).

$$0°\text{ C.}<T_1-T_2 \leq 60°\text{ C.} \tag{i}$$

$$S_1-S_2 \leq 25\% \tag{ii}$$

$$80°\text{ C.} \leq T_1 \leq 200°\text{ C.} \tag{iii}$$

$$60°\text{ C.} \leq T_2 \tag{iv}$$

[wherein, $S_1$ denotes a heat shrinkage rate (%) at the temperature $T_1$, and $S_2$ denotes a heat shrinkage rate $S_2$(%) at the temperature $T_2$.]

With the cover tape having the above-mentioned configuration, the slack after heat sealing can be furthermore reduced, and the dimensional change before and after heat sealing is sufficiently suppressed. That is to say, with the cover tape having the above-mentioned configuration, the reduction of slack after heat sealing and the suppression of the dimensional change can be achieved concurrently.

The reason why the above-mentioned effect is achieved is not necessarily clear but it is thought as follows. That is to say, in the taping reel method, the cover tape is disposed so that it covers an electronic part accommodating pocket of the carrier tape, both edge portions in the transverse direction of the pocket are thermally pressurized and heat sealed by using a heat sealing iron.

Herein, the cover tape is heated not only in a heated portion with which the heat sealing iron is brought into direct contact but also in a periphery thereof (for example, a portion positioned above an electronic part accommodating pocket) inevitably. For example, when the temperature of the heat sealing iron is defined as $T_1$, the periphery is thought to be heated to a temperature that is lower than $T_1$ (for example, $T_2$). At this time, in the cover tape described in, for example, Patent Literature 2, a heated portion and other portions thermally shrink at the same level; as a result, dimensional change may occur in the cover tape as a whole.

In contrast, the cover tape having the above-mentioned configuration has a sufficient heat shrinkage rate at a temperature applied to the heated portion (for example, $T_1$), and therefore slack after heat sealing is sufficiently reduced. On the other hand, as shown in the above-mentioned formula (II), since difference between heat shrinkage rate at $T_1$ and the heat shrinkage rate at $T_2$ is 20% or more, in the portion other than a heated portion, the thermal shrinkage is more suppressed as compared with the heated portion, and it is thought that the dimensional change in the cover tape as a whole is suppressed.

The cover tape according to the present invention may include, for example, a base material layer, a seal layer, and an intermediate layer disposed between the base material layer and the seal layer.

In this case, in the cover tape according to the present invention, it is preferable that the base material layer the seal layer and the intermediate layer be composed of a resin composition containing a polyolefin-based resin, and more preferable that the gel fraction of the resin composition constituting the intermediate layer be 5 to 80% by mass.

In the cover tape of the present invention, it is thought that the intermediate layer functions as a cushion layer for uniformly dispersing pressurization during thermal pressurization using the heat sealing iron. Since such an intermediate layer has the above-mentioned configuration, peeling strength between the cover tape and the carrier tape is further stabilized. Furthermore, according to the cover tape having the above-mentioned configuration, since floating of the intermediate layer is sufficiently suppressed, the occurrence of floating-up in the end portions in the transverse direction of the cover tape can be further suppressed.

The "gel fraction" as referred to in the specification denotes a value measured by the following method. That is to say, the initial mass of a sample to be measured is measured, and then the sample is immersed in boiling paraxylene for 12 hours, an insoluble content is eluted, and the mass of the insoluble content after drying is measured. Then, the value calculated from the following formula is defined as the "gel fraction."

Gel fraction(% by mass)=(Mass of insoluble content/ Initial mass of sample to be measured)×100

In the cover tape according to the present invention, it is preferable that the thickness of the seal layer be 0.5 to 15% with respect to the thickness of the entire cover tape.

The cover tape having a thickness of the seal layer in the above-mentioned range has a better adhesiveness to the carrier tape, and has higher rigidity. With the cover tape having such a high rigidity, rocking of a packaged electronic part can be further suppressed.

In the cover tape according to the present invention, it is preferable that a surface intrinsic resistance value of the seal layer be $1 \times 10^4$ to $1 \times 10^{13} \Omega$. Such a cover tape enables suppression of occurrence of static electricity generated when the cover tape after heat sealing is peeled off from the carrier tape.

The present invention further provides a method for manufacturing a cover tape to manufacture the above-mentioned cover tape. The method for manufacturing a cover tape according to the present invention includes a step of heat stretching a laminated body including at least a first layer structure including a resin composition constituting the base material layer, and a second layer structure including a resin composition constituting the intermediate layer.

With the method for manufacturing a cover tape according to the present invention, the above-mentioned cover tape can be easily manufactured.

The present invention further provides an electronic part package using the cover tape according to the present invention.

Since the electronic part package according to the present invention uses the cover tape according to the present invention, tight taping is carried out regardless of materials of the carrier tape, and thus it is possible to suppress rocking of an electronic part in transporting the electronic part package.

Advantageous Effects of Invention

The present invention can provide a cover tape capable of sufficiently reducing slack generated in the carrier tape after heat sealing. Furthermore, the present invention can provide a method for manufacturing the cover tape and an electronic part package using the cover tape.

DESCRIPTION OF EMBODIMENTS

Hereinafter, a preferable embodiment of the present invention will be described in detail with reference to drawings. The present invention is not limited to the embodiment mentioned below, but can be variously modified and changed within the scope of the present invention for working.

Figure 1:
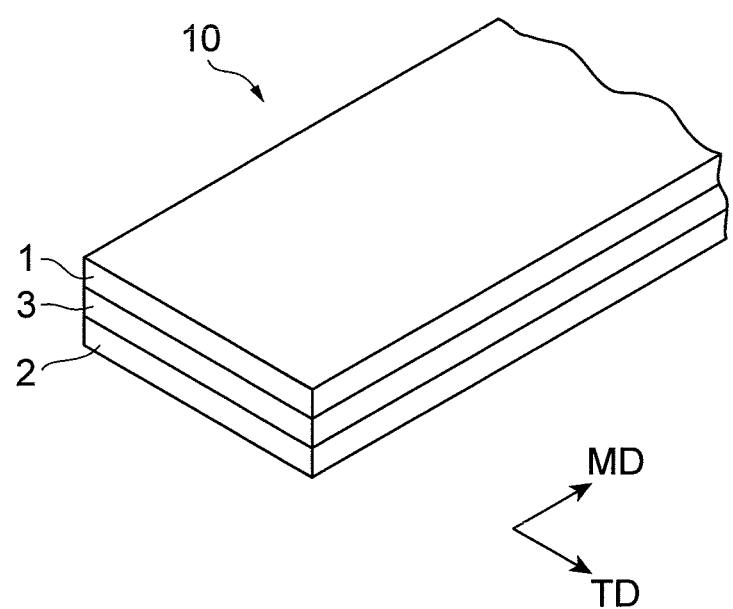
FIG. 1 is a schematic perspective view showing a cover tape according to one preferable embodiment of the present invention.

FIG. 1 is a schematic perspective view showing a cover tape according to one preferable embodiment of the present invention. The cover tape 10 shown in FIG. 1 includes a seal layer 1, a base material layer 2, and an intermediate layer 3 disposed between the seal layer 1 and the base material layer 2. The cover tape 10 has a temperature at which a heat shrinkage rate in at least one of the machine direction (MD) and the transverse direction (TD) perpendicular to the machine direction is 5% or more between 80° C. to 200° C. In FIG. 1, the intermediate layer 3 is shown to include a single layer structure, but the intermediate layer 3 may have a multi-layer structure.

The cover tape 10 according to this embodiment has the above-mentioned configuration and, therefore, can sufficiently reduce slack after heat sealing, which has been generated in a conventional cover tape regardless of the materials of the carrier tape. That is to say, the cover tape 10 according to this embodiment enables tight taping after it is heat sealed to a carrier tape.

Figure 2:
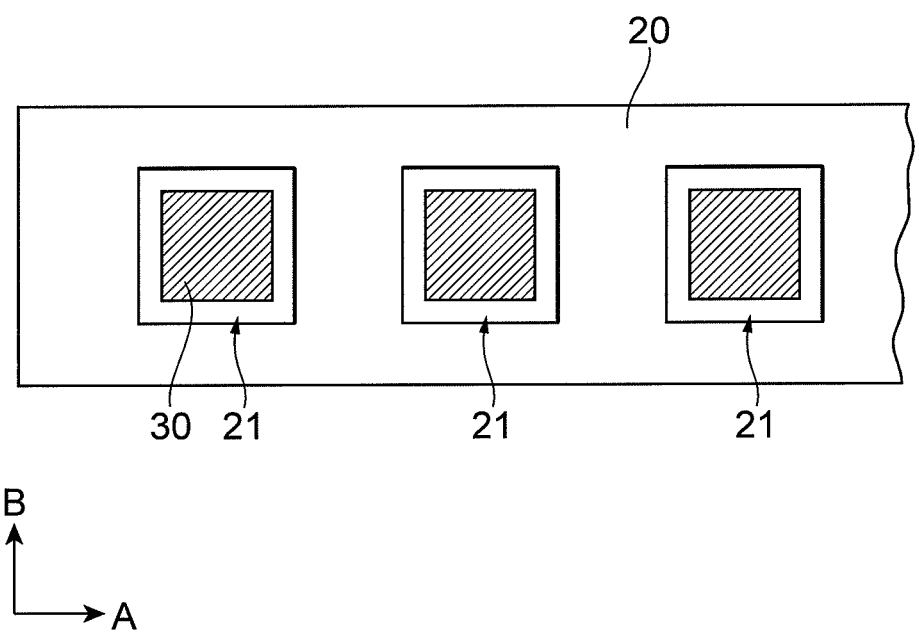
FIG. 2 is a schematic top view showing a carrier tape in which an electronic part is inserted.

The cover tape according to this embodiment is used as a cover tape for wrapping an electronic part in, for example, the above-mentioned taping reel method. FIG. 2 is a schematic top view showing a carrier tape in which an electronic part is inserted, which is used in the taping reel method. A carrier tape 20 is provided with electronic part accommodating pockets 21 at a certain interval in the length direction A of the carrier tape 20. Then, an electronic part 30 is inserted in each of the pockets 21.

Figure 3:
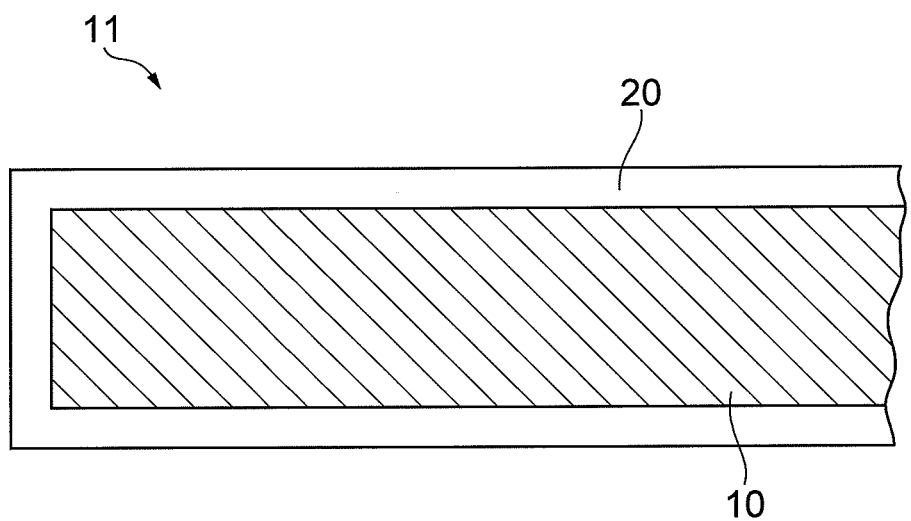
FIG. 3 is a schematic top view showing an electronic part package according to one preferable embodiment of the present invention.

FIG. 3 is a schematic top view showing an electronic part package obtained by heat sealing a cover tape from the upper section of the carrier tape shown in FIG. 2 so as to seal the electronic part. In the electronic part package 11, the cover tape 10 is heat sealed to the upper section of the carrier tape 20 in which the electronic part 30 has been inserted. Since such an electronic part package 11 has a shape of the tape, it can be wound up in a reel shape, stored and transported.

The electronic part package 11 which has wound up in the reel shape is transported to a mounter manufacturer or the like where the cover tape 10 is peeled off from the carrier tape 20, the accommodated electronic part 30 is adsorbed by using an air adsorption nozzle and the like, and then mounted on a circuit board in a step for producing, for example, a circuit board.

Figure 4:
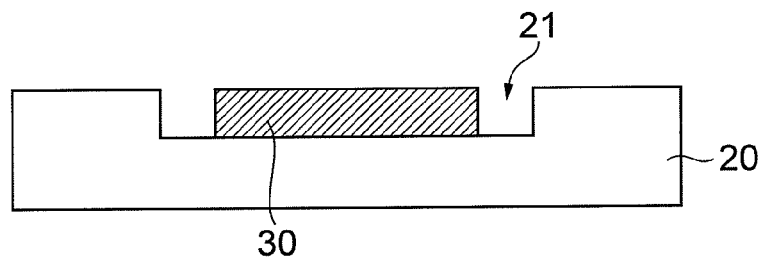
FIG. 4 is a schematic sectional view showing a method for manufacturing an electronic part package according to one preferable embodiment.
Figure 4:
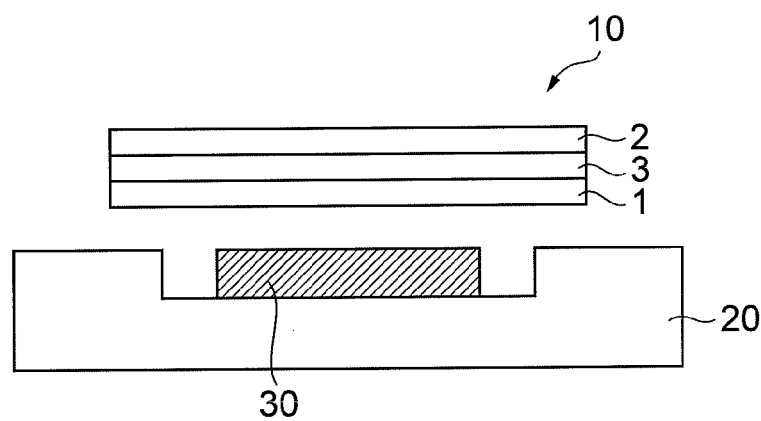
Figure 4:
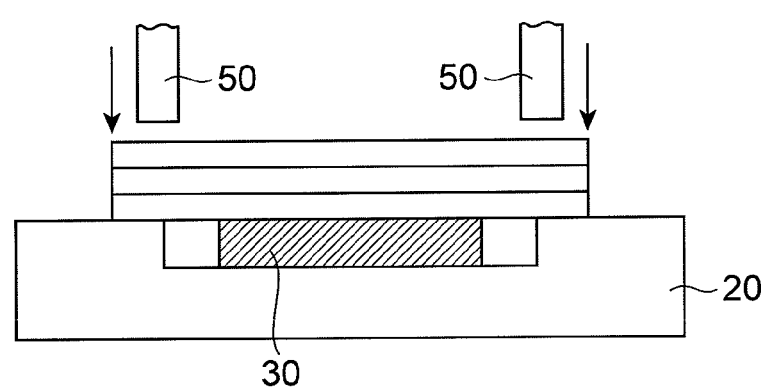
Figure 4:
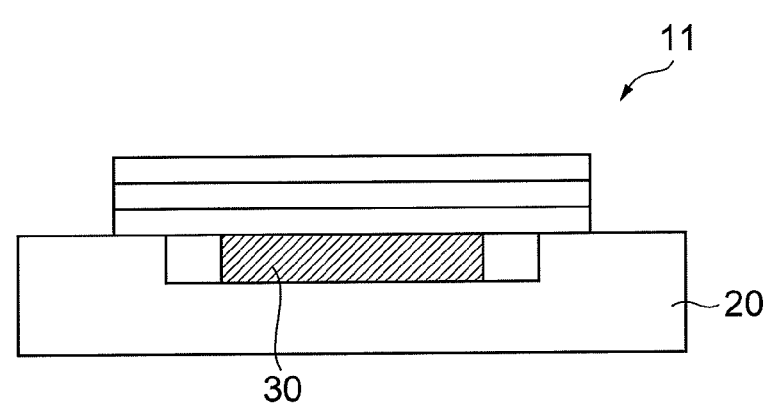

FIG. 4 is a schematic sectional view showing a method for manufacturing an electronic part package according to one embodiment. FIG. 4(a) is a schematic sectional view of the carrier tape 20 shown in FIG. 2, in which the electronic part 30 is inserted in the electronic part accommodating pocket 21 of the carrier tape 20.

In a method for manufacturing an electronic part package according to this embodiment, firstly, as shown in FIG. 4(b), the cover tape 10 is placed so that it covers the electronic part accommodating pocket 21 of the carrier tape 20 in which the electronic part 30 has been inserted. Herein, the cover tape 10 is placed in such a manner that a surface of the carrier tape 20 on which the electronic part accommodating pocket 21 is formed faces the seal layer 1.

Next, as shown in FIG. 4(c), in both edge portions in the transverse direction (B direction in FIG. 2) of the electronic part accommodating pocket 21, the cover tape 10 is thermally pressurized by a heat sealing iron 50. Herein, a heating temperature of the heat sealing iron 50 is preferably a temperature at which a heat shrinkage rate in at least one direction of MD and TD of the cover tape 10 is 5% or more. By heat sealing at such a temperature, slack of the cover tape 10 is further reduced.

FIG. 4(d) is a schematic sectional view showing an electronic part package manufactured by a method for manufacturing an electronic part package according to this embodiment. Tight taping free from slack is made to the electronic part package 11 by the above-mentioned cover tape 10. Therefore, the electronic part 30 accommodated in the electronic part package 11 is held stably in the electronic part package 11 so that it does not move to the outside of electronic part accommodating pocket 21 and does not excessively rock due to vibration during transport and the like.

Hereinafter, the cover tape 10 according to this embodiment is described in more detail.

It is preferable that the cover tape 10 used for the electronic part package 11 have, for example, the following properties. It is preferable that the cover tape 10 have the properties that: (1) the cover tape 10 has a good adhesive strength with respect to the carrier tape 20; (2) the cover tape 10 can be stably peeled off from the carrier tape; (3) the cover tape 10 is excellent in the so-called antistatic property of preventing the electronic part 30 from going out from the electronic part accommodating pocket 21 due to electric charge by peeling generated in peeling from the carrier tape; and (4) the cover tape 10 is excellent in position controlling of the electronic part 30 in order to prevent the electronic part 30 from moving out of electronic part accommodating pocket 21 during transport or electronic part 30 from being damaged due to vibration during transport.

However, in a conventional cover tape, slack easily occurs after heat sealing, and has problems that: (1) unnecessary space is formed in the upper section of the electronic part accommodating pockets 31; and (2) a gap is formed between the carrier tape 20 and the cover tape in between the electronic part accommodating pockets 31. In the above-mentioned problem (1), the electronic part 30 may unnecessarily rock and be damaged in the electronic part accommodating pocket 21. In addition, in the above-mentioned problem (2), the electronic part 30 may move from the electronic part accommodating pocket 21 to the gap between the carrier tape 20 and the cover tape during transport.

In contrast, the cover tape 10 according to this embodiment has the above-mentioned configuration, and therefore, slack after heat sealing, which has generated in a conventional cover tape, can be sufficiently reduced. That is to say, the cover tape 10 according to this embodiment enables tight taping after it is heat sealed to a carrier tape 20. Therefore, the electronic part package 11 using the cover tape 10 is excellent in position control of the electronic part 30.

The cover tape 10 according to this embodiment has a temperature at which a heat shrinkage rate in at least one direction of MD and TD is preferably 5% to 90%, more preferably 7% to 85%, and furthermore preferably 8% to 80% between 80° C. to 200° C. With such a cover tape 10, by carrying out heat sealing at a temperature at which the heat shrinkage rate is in the above-mentioned range, it is possible to carry out taping in which slack is more reduced.

It is preferable that the cover tape 10 according to this embodiment have a temperature at which both the heat shrinkage rate in MD and the heat shrinkage rate in TD are 5% or more between 80° C. to 200° C. Furthermore, the cover tape 10 has a temperature at which both the heat shrinkage rate in MD and the heat shrinkage rate in TD are preferably 5% to 90%, more preferably 7% to 85%, and furthermore preferably 8% to 80%. With such a cover tape 10, by carrying out heat sealing at a temperature at which the heat shrinkage rate is in the above-mentioned range, it is possible to carry out taping in which slack is more reduced.

The cover tape 10 according to this embodiment enables taping in which slack is reduced regardless of materials of the carrier tape 20. That is to say, even when the carrier tape made of materials such as polystyrene, polyethylene terephthalate, polycarbonate, and polypropylene is used, by carrying out heat sealing using the cover tape 10 according to this embodiment, it is possible to carry out taping in which slack is sufficiently reduced.

It is preferable that the cover tape 10 according to this embodiment have a temperature $T_1$ (° C.) and a temperature $T_2$ (° C.) satisfying the following formulae (i) to (iv) in at least one direction of MD and TD. In the formulae, $S_1$ denotes a heat shrinkage rate (%) at the temperature $T_1$, and $S_2$ denotes a heat shrinkage rate $S_2$(%) at the temperature $T_2$.

$$0° C. < T_1 - T_2 \leq 60° C. \tag{i}$$

$$S_1 - S_2 \geq 25\% \tag{ii}$$

$$80° C. \leq T_1 \leq 200° C. \tag{iii}$$

$$60° C. \leq T_2 \tag{iv}$$

Furthermore, it is preferable that the temperature $T_1$ (° C.) and the temperature $T_2$ (° C.) further satisfy the following formulae (v) and (vi).

$$140° C. \leq T_1 \leq 180° C. \tag{v}$$

$$80° C. \leq T_2 \leq 120° C. \tag{vi}$$

That is to say, it is preferable that, for example, in the cover tape 10, in at least one direction of MD and TD, the difference ($S_1$-$S_2$) between the heat shrinkage rate ($S_1$) at 140° C. and the heat shrinkage rate ($S_2$) at 80° C. be 25% or more.

Such a cover tape 10 enables further reduction of slack after heat sealing and sufficient suppression of dimensional change before and after heat sealing. That is to say, with the cover tape 10 having the above-mentioned configuration, reduction of slack after heat sealing and suppression of dimensional change can be achieved simultaneously.

The reason why the above-mentioned effect is achieved is not necessarily clear but it is thought as follows. That is to say, when thermal pressurization is carried out by using the heat sealing iron 50, the cover tape 10 is heated not only in a heated portion with which the heat sealing iron 50 is brought into direct contact but also in a periphery thereof (for example, a portion above the electronic part accommodating pocket 21) inevitably. The temperature applied at this time is different between the heated portion and the periphery. Herein, for example, in a conventional cover tape, since the difference between the heat shrinkage rate by temperatures is small, the same level of thermal shrinkage occurs in the heated portion and the periphery thereof, which may cause dimensional change in the entire cover tape.

In contrast, the cover tape 10 having the above-mentioned configuration has a sufficient heat shrinkage rate at a temperature (for example, $T_1$) applied to the heated portion, and therefore slack after heat sealing is sufficiently reduced. On the other hand, in the periphery of the heated portion, the heat shrinkage rate at a temperature (for example, $T_2$) applied to the periphery of the heated portion is low, and therefore, the thermal shrinkage is suppressed as compared with that in the heated portion. It is thought that the thermal shrinkage in the periphery of the heated portion can be suppressed and thereby the dimensional change in the entire cover tape 10 is suppressed.

Furthermore, with the cover tape 10 having the above-mentioned configuration, since the heated portion with which the heat sealing iron 50 is brought into direct contact has a sufficient heat shrinkage rate, slack after heat sealing can be sufficiently reduced; thus, it is thought that the lower limit temperature of heat sealing can be set lower.

Herein, the heat shrinkage rate at a predetermined temperature is determined by the following method. Firstly, a film sample of the cover tape 10, which has been cut in 100 mm×100 mm, is placed in an air oven thermostat set at a predetermined temperature, and the sample is heat treated for 10 min in a state in which the sample freely shrinks; then, the distance between the center portions of the opposite sides is measured in each of MD and TD to obtain a shrinkage amount of the film; the obtained shrinkage amount of the film is divided by the original dimension (distance between the center portions of the opposite sides before heat treatment) to calculate the percentage. This procedure is repeated twice to calculate an arithmetic mean value of twice measurement results in each of MID and TD; the arithmetic mean values are defined as the heat shrinkage rates at a predetermined temperature in MD and TD, respectively.

Furthermore, slack of the cover tape is measured by, for example, the following method. That is to say, displacement in MD and TD of the cover tape 10 after heat sealing is measured by using a laser microscope. The difference in the displacement in the cover tape 10 in MD and TD is preferably 100 µm or less, more preferably 70 µm or less, and furthermore preferably 50 µm or less. It is preferable that the difference in the displacement in MD and TD be 100 µm or less because slack in the cover tape 10 is reduced, a gap between the carrier tape 20 and the cover tape 10 is small, damage to electronic part 30 due to vibration during transport can be prevented, and electronic part 30 can be prevented from moving out from the electronic part accommodating pocket 21.

It is preferable that the cover tape 10 have a heat shrinkage rate of 5% or less at 60° C. in at least one direction of MD and TD. Furthermore, it is more preferable that the cover tape 10 have a heat shrinkage rate of 5% or less at 60° C. in both directions of MD and TD. With such a cover tape, the dimensional change of the cover tape during storage is suppressed, and therefore the cover tape is excellent in storage stability.

The surface intrinsic resistance value of the seal layer 1 of the cover tape 10 is preferably $1 \times 10^4$ to $1 \times 10^{13} \Omega$, and more preferably $1 \times 10^7$ to $1 \times 10^{11} \Omega$. When the surface intrinsic resistance value of the seal layer 1 is $1 \times 10^{13} \Omega$ or less, the electronic part 30 can be sufficiently prevented from moving out from the electronic part accommodating pocket 21 due to electric charge by peeling generated in peeling from the carrier tape.

The peeling strength of the cover tape 10 is preferably 10 to 130 g, and more preferably 20 to 100 g. When the peeling strength is 10 g or more, the cover tape 10 is not easily peeled off from the carrier tape 20 due to vibration during transport or during storage, and loss of the wrapped electronic part 30 can be prevented. Furthermore, when the peeling strength is 130 g or less, failure such as breakage of the cover tape 10 during peeling is reduced.

The thickness of the cover tape 10 is preferably 10 to 100 µm, and more preferably 20 to 90 µm. A thickness of the cover tape of 10 µm or more is preferable because the running property of the tape in the taping machine is stabilized; a thickness of the cover tape of 100 µm or less is preferable because stable peeling strength is easily obtained during heat sealing.

FIG. 1 and the like describe the case in which the cover tape 10 includes one layer of each of the seal layer 1, the base material layer 2 and the intermediate layer 3; however, the cover tape of the present invention is not limited to this form. The cover tape of the present invention can include a plurality of seal layers, a plurality of base material layers, and a plurality of intermediate layers. For example, the cover tape of the present invention may be a laminated body in which a base material layer/an intermediate layer/a base material layer/a seal layer are laminated in this order. Furthermore, the cover tape of the present invention may further include a layer other than the seal layer, the base material layer and the intermediate layer.

Next, each layer constituting the cover tape 10 is described in detail.

[Seal Layer 1]

The seal layer 1 is a layer constituting a surface to which a wrapped product of a carrier tape or the like adhesively bonds.

Examples of the seal layer 1 include a layer made of a base resin, and a layer made of a tackifier and a base resin. It is preferable that the seal layer 1 contain a tackifier, because the cover tape 10 has an improved sealing property, and a better adhesive strength with respect to the wrapped product of the carrier tape or the like.

Examples of the tackifier include a rosin-based resin, a terpene-based resin, a petroleum resin, a styrene resin, and a cumarone-indene resin. It is preferable that these tackifiers be selected from the viewpoint of composition and tack of a seal layer, viscosity, and holding power. Note that these tackifiers can be used singly or in combinations of two or more.

The rosin-based resin is preferable because it has a small average molecular weight and sharp molecular weight distribution, and has wide range of compatibility with respect to the below mentioned base resin. Examples of the rosin-based resin include rosin ester.

The terpene-based resin is preferable because it has good compatibility, can easily obtain balance of viscosity property in a wide range of resin concentration, and has viscosity and peeling imparting property at low temperatures. Examples of the terpene-based resin include a terpene resin, a terpene-based hydrogenated resin, and a terpene phenol copolymer.

Examples of the petroleum resin include an aromatic petroleum resin, an alicyclic petroleum resin, and a hydrogenated petroleum resin. Note that the hydrogenated petroleum resin can be manufactured by hydrogenation of, for example, specified aliphatic resins, aromatic resins, and copolymers thereof, as well as by hydrogenation of aromatic resins. The alicyclic hydrogenated petroleum resin is particularly preferable because it has excellent thermal stability and can easily adjust compatibility with other resin on the basis of the degree of hydrogenation.

Examples of the base resin include an ethylene-vinyl acetate copolymer, an ethylene-aliphatic unsaturated carboxylic acid copolymer and an ethylene-aliphatic unsaturated carboxylic acid ester copolymer, a polyolefin-based resin and a mixture thereof.

Among them, it is preferable that the base resin include at least one resin selected from an ethylene-vinyl acetate copolymer (EVA), an ethylene-aliphatic unsaturated carboxylic acid copolymer and an ethylene-aliphatic unsaturated carboxylic acid ester copolymer, and a polyolefin-based resin. When the seal layer 1 contains such resins, a cover film has an improved sealing property, and a better adhesive strength with respect to a wrapped product of a carrier tape or the like.

Herein, the above-mentioned ethylene-vinyl acetate copolymer refers to a copolymer obtained by copolymerization of an ethylene monomer and vinyl acetate. Furthermore, the ethylene-aliphatic unsaturated carboxylic acid copolymer refers to a copolymer obtained by copolymerization of an ethylene monomer and at least one monomer selected from aliphatic unsaturated carboxylic acid. Furthermore, the ethylene-aliphatic unsaturated carboxylic acid ester copolymer refers to a copolymer obtained by copolymerization of an ethylene monomer and at least one monomer selected from aliphatic unsaturated carboxylic acid ester.

The above-mentioned copolymerization can be carried out by, for example, a high-pressure process, and a melting method. Note that as a catalyst for copolymerization reaction, for example, a multi-site catalyst and a single-site catalyst can be used. Furthermore, in the above-mentioned copolymer, the bond form of each monomer is not particularly limited, and a polymer having a bond form such as a random bond and a block bond can be used. From the viewpoint of optical characteristic, as the above-mentioned copolymer, a copolymer polymerized by using a high-pressure process, and a copolymer having a random bond is preferable.

From the viewpoint of optical characteristics and adhesiveness, in the above-mentioned ethylene-vinyl acetate copolymer, the rate of vinyl acetate in whole monomers constituting the copolymer is preferably 10 to 40% by mass, more preferably 13 to 35% by mass, and furthermore preferably 15 to 30% by mass. From the viewpoint of the extrusion property, the melt flow rate value (hereinafter, sometimes referred to as "MFR") measured according to JIS-K-7210 (190° C., 2.16 kg) is preferably 0.3 g to 30 g, more preferably 0.5 g to 30 g, and furthermore preferably 0.8 g to 25 g.

Examples of the ethylene-aliphatic unsaturated carboxylic acid copolymer include ethylene-acrylic acid copolymer (hereinafter, sometimes referred to as "EAA"), and ethylene-methacrylic acid copolymer (hereinafter, sometimes referred to as "EMAA").

Examples of the ethylene-aliphatic unsaturated carboxylic acid ester copolymer include ethylene-acrylic acid ester copolymer, and ethylene-methacrylic acid ester copolymer. As the acrylic acid ester and methacrylic acid ester, esters with alcohol having 1 to 8 carbon atoms, for example, methanol and ethanol, is preferably used.

These copolymers may be a multi-component copolymer prepared by copolymerizing three components or more of monomers. Examples of the multi-component copolymer include a copolymer prepared by copolymerizing at least three monomers selected from ethylene, aliphatic unsaturated carboxylic acid and aliphatic unsaturated carboxylic acid ester.

In the ethylene-aliphatic unsaturated carboxylic acid copolymer, the rate of aliphatic unsaturated carboxylic acid with respect to whole monomers constituting the copolymer is preferably 3 to 35% by mass. Furthermore, MFR (190° C., 2.16 kg) is preferably 0.3 g to 30 g, more preferably 0.5 g to 30 g, and furthermore preferably 0.8 g to 25 g.

In the ethylene-aliphatic unsaturated carboxylic acid ester copolymer, the rate of aliphatic unsaturated carboxylic acid ester with respect to whole monomers constituting the copolymer is preferably 3 to 35% by mass. Furthermore, MFR (190° C., 2.16 kg) is preferably 0.3 g to 30 g, more preferably 0.5 g to 30 g, and furthermore preferably 0.8 g to 25 g.

Examples of the polyolefin-based resin include a polyethylene-based resin, a polypropylene-based resin, and a polyolefin-based polymer alloy.

Examples of the polyethylene-based resin include polyethylene, and an ethylene-α-olefin copolymer.

Examples of the polyethylene include high density polyethylene, medium density polyethylene, low density polyethylene (LDPE), and very low density polyethylene.

Herein, polyethylene is classified on the basis of the density based on JIS K 6922. Specifically, polyethylene having a density of 0.942 g/cm$^3$ or higher is referred to as high density polyethylene, polyethylene having a density of 0.930 g/cm$^3$ or higher and lower than 0.942 g/cm$^3$ is referred to as medium density polyethylene, polyethylene having a density of 0.910 g/cm$^3$ or higher and lower than 0.930 g/cm$^3$ is referred to as low density polyethylene, and polyethylene having a density of lower than 0.910 g/cm$^3$ is referred to as very low density polyethylene.

The high density polyethylene can be manufactured by generally known processes such as the Phillips process, the Standard process, and the Ziegler process.

Examples of the medium density polyethylene include linear medium density polyethylene; examples of the low density polyethylene include linear low density polyethylene (LLDPE), and a high-pressure process low density polyethylene. Note that the high-pressure process low density polyethylene is a low density polyethylene manufactured by a so-called high-pressure process (massive polymerization process).

Examples of the very low density polyethylene include linear very low density polyethylene (referred to as "VLDPE," "ULDPE").

The above-mentioned ethylene-α-olefin copolymer refers to a copolymer composed of ethylene and at least one selected from α-olefins. The ethylene-α-olefin copolymer is preferably a copolymer composed of ethylene and at least one selected from α-olefins having 3 to 20 carbon atoms, and more preferably a copolymer composed of ethylene and at least one selected from α-olefins having 3 to 12 carbon atoms. Examples of the α-olefin include propylene, 1-butene, 1-pentene, 1-hexene, 1-octene, 4-methyl-1-pentene, 3-methyl-1-pentene, 1-decene, 1-dodecen, 1-tetradecene, 1-hexadecene, 1-octadecene, and 1-eicosane; these may be used singly or in combinations of two or more. Furthermore, the rate (on a charge monomer basis) of α-olefin with respect to whole monomers constituting the copolymer is preferably 6 to 30% by mass. Furthermore, it is preferable that the ethylene-α- olefin copolymer be a soft copolymer, and has a degree of crystallinity by the X-ray method is 30% or less.

Furthermore, as the ethylene-α-olefin copolymer, a copolymer of ethylene and at least one comonomer selected from a propylene comonomer, a butene comonomer, a hexene comonomer and an octene comonomer is generally available easily and can preferably be used.

The polyethylene-based resin can be polymerized by using a known catalyst such as a single-site catalyst and a multi-site catalyst; it is preferable that the polyethylene-based resin be polymerized by using a single-site catalyst. Furthermore, from the viewpoint of the cushion property, the density of the polyethylene-based resin is preferably 0.860 to 0.920 g/cm$^2$, more preferably 0.870 to 0.915 g/cm$^2$, and furthermore preferably 0.870 to 0.910 g/cm$^2$. The lower the density of the polyethylene-based resin is, the more the cushion property tends to be improved. When the density is 0.920 g/cm$^2$ or less, transparency tends to be improved. When the high density resin is used, by adding the low density polyethylene at the rate of about, for example, 30% by mass, the transparency can be also improved.

From the viewpoint of the sealing property, MFR (190° C., 2.16 kg) of the polyethylene-based resin is preferably 0.5 g to 30 g, more preferably 0.8 g to 30 g, and furthermore preferably 1.0 g to 25 g.

As the polyethylene-based resin, a polyethylene-based copolymer whose crystalline/amorphous structure (morphology) is controlled in nano-order can be used.

As the polypropylene-based resin, polypropylene, a propylene-α-olefin copolymer, and a ternary copolymer of propylene, ethylene and α-olefin, and the like, can be preferably used.

The propylene-α-olefin copolymer refers to a copolymer composed of propylene and at least one selected from α-olefins. The propylene-α-olefin copolymer is preferably a copolymer composed of propylene and at least one selected from ethylene and α-olefins having 4 to 20 carbon atoms, and more preferably a copolymer composed of propylene and at least one selected from ethylene and α-olefins having 4 to 8 carbon atoms. Here, examples of the α-olefin having 4 to 20 carbon atoms include propylene, 1-butene, 1-pentene, 1-hexene, 1-octene, 4-methyl-1-pentene, 3-methyl-1-pentene, 1-decene, 1-dodecen, 1-tetradecene, 1-hexadecene, 1-octadecene, and 1-eicosane; these may be used singly or in combinations of two or more. Furthermore, the content rate (on a charge monomer basis) of ethylene and/or α-olefin with respect to whole monomers constituting the propylene-α-olefin copolymer is preferably 6 to 30% by mass. Furthermore, it is preferable that the propylene-α-olefin copolymer be a soft copolymer, and have the degree of crystallinity by the X-ray method is 30% or less.

As the propylene-α-olefin copolymer, a copolymer of propylene and at least one comonomer selected from an ethylene comonomer, a butene comonomer, a hexene comonomer and an octene comonomer is generally available easily and preferably can be used.

The polypropylene-based resin can be polymerized by using a known catalyst such as a single-site catalyst and a multi-site catalyst. It is preferable to polymerize the polypropylene-based resin by using a single-site catalyst. Furthermore, from the viewpoint of the cushion property, the density of the polypropylene-based resin is preferably 0.860 to 0.920 g/cm$^2$, more preferably 0.870 to 0.915 g/cm$^2$, and furthermore preferably 0.870 to 0.910 g/cm$^2$. The lower the density of the polypropylene-based resin is, the more the adhesion property tends to be improved. When the density is 0.920 g/cm$^2$ or less, transparency tends to be improved.

From the viewpoint of the sealing property, MFR (230° C., 2.16 kgf) of the polypropylene-based resin is preferably 0.3 g to 25.0 g, more preferably 0.5 g to 20 g, and furthermore preferably 0.8 g to 15 g.

As the polypropylene-based resin, a polypropylene-based copolymer whose crystalline/amorphous structure (morphology) is controlled in nano-order can be used.

As the polypropylene-based resin, a copolymer of propylene and α-olefins such as ethylene, butene, hexene, and octene, or a ternary copolymer of propylene, ethylene and α-olefins such as butene, hexene and octene, and the like, can be preferably used. These copolymers may be in the form of any of a block copolymer, a random copolymer, and the like; a random copolymer of propylene and ethylene or a random copolymer of propylene, ethylene and butene is preferable.

The polypropylene-based resin may be not only resin polymerized using catalysts such as a Ziegler-Natta catalyst, but also resin polymerized using a metallocene catalyst and the like; for example, syndiotactic polypropylene and isotactic polypropylene can be also used. Furthermore, the rate (on a charge monomer basis) of propylene with respect to whole monomers constituting the polypropylene-based resin is preferably 60 to 80% by mass. Furthermore, from the viewpoint of excellent thermal shrinkage, a ternary copolymer is preferable in which the content rate (on a charge monomer basis) of propylene with respect to whole monomers constituting the polypropylene-based resin is 60 to 80% by mass, the content rate (on a charge monomer basis) of ethylene is 10 to 30% by mass, and the content rate (on a charge monomer basis) of butene is 5 to 20% by mass.

Furthermore, when a base resin contains the polypropylene-based resin, resin prepared by uniformly finely dispersing a rubber component with high density of 50% by mass or less with respect to the total amount of the polypropylene-based resin is preferably used as the base resin. Herein, examples of the rubber components include ethylene-propylene rubber component (EPR).

When the seal layer 1 is composed of only a tackifier and a base resin, the content of the tackifier in the seal layer 1 is preferably 5 to 40% by mass, more preferably 10 to 30% by mass, and furthermore preferably 15 to 30% by mass with respect to the total amount of the seal layer. When the content of the tackifier is in such a range, the transparency and the adhesive performance of the seal layer tend to be improved.

Furthermore, when the seal layer 1 is composed of only a tackifier and a base resin, the content of the base resin in the seal layer 1 is preferably 60 to 95% by mass, more preferably 60 to 90% by mass, and furthermore preferably 55 to 85% by mass with respect to the total amount of the seal layer.

The seal layer 1 may further include an antistatic agent in addition to the tackifier and the base resin.

Examples of the antistatic agent include a polymeric antistatic agent, a surfactant, electrically conductive fine powder, and the like; among them, the polymeric antistatic agent is preferable. Examples of the polymeric antistatic agent include an ionomer resin and a polyether copolymer. With such a polymeric antistatic agent, the antistatic property can be added without loss of the transparency and the sealing property.

As the ionomer resin, resin in which a carboxyl group is substituted by potassium or lithium ion is preferable.

Examples of the polyether copolymer include a polyether/polyolefin block copolymer. It is preferable that the polyether copolymer include 2 to 30% of lithium salt. When such a polyether copolymer is used, the conductive performance is further improved.

The content of the antistatic agent in the seal layer 1 is preferably 5 to 40% by mass, more preferably 10 to 30% by mass, and furthermore preferably 15 to 30% by mass with respect to the total amount of the seal layer.

It is particularly preferable that the seal layer 1 include 10 to 30% by mass of tackifier, 40 to 80% by mass of at least one resin selected from the group consisting of an ethylene-vinyl acetate copolymer, an ethylene-aliphatic unsaturated carboxylic acid copolymer, an ethylene unsaturated carboxylic acid ester copolymer, and a polyolefin-based resin, and 10 to 30% by mass of at least one antistatic agent selected from an ionomer resin and a polyether copolymer. When the seal layer includes such materials, the sealing property is more improved.

The seal layer 1 may include arbitrary additives such as various electrically conductive materials, a lubricant, a plasticizer, an antioxidant, an ultraviolet absorber, a colorant, various surfactants, an anti-blocking agent, and inorganic filler as long as the property is not damaged. Furthermore, the seal layer 1 may be subjected to coating treatment.

Herein, examples of the anti-blocking agent include inorganic particles such as silica and alumina and cyclic olefin. In particular, the cyclic olefin is preferable because it does not drop off during taping, and can be prevented from attaching to the content (electronic part). Examples of the cyclic olefin include APEL (product name) manufactured by MITSUI CHEMICALS, INC. and TOPAS (product name) manufactured by Topas Advanced Polymers. The anti-blocking agent can be used singly or in combinations of two or more.

The seal layer 1 may be a single layer, or composed of a plurality of layers. For example, it may be a laminate of a plurality of layers including a layer containing a tackifier and a layer containing an antistatic agent; in this case, the order of laminating of the layers may be an order of a layer containing a tackifier and a layer containing an antistatic agent, and may be the order of a layer containing an antistatic agent, and a seal layer containing a tackifier as viewed from the outermost layer side of the film. Note that only seal layers in which a tackifier and an antistatic agent are mixed may be disposed as a seal layer.

It is preferable that the thickness of the seal layer 1 be 0.5 to 15% with respect to the thickness of the entire cover tape 10. When the thickness of the seal layer is 0.5% or more, the adhesive strength with respect to the carrier tape is easily obtained stably; it is preferable that the thickness of the seal layer be 15% or less, because the rigidity and shrinkage property of the cover tape 10 are sufficiently obtained.

[Base Material Layer 2]

The base material layer 2 is a layer constituting the outermost surface opposite to the seal layer 1. The base material layer 2 gives rigidity and heat resistance to the cover tape 10. That is to say, as the base material layer 2, a layer including a resin composition having rigidity and heat resistance is preferable.

It is preferable that the base material layer 2 contain, as a resin component, polyesters such as polymethylene terephthalate, polyethylene terephthalate, polytrimethylene terephthalate, polybutylene terephthalate, polyethylene naphthalate, and polylactic acid; aliphatic polyamide polymers such as nylon 6, nylon 12 and nylon 66; aliphatic polyamide copolymers such as nylon 6/66 and nylon 6/12; aromatic polyamide polymers such as MXD6 (polymethaxylene adipamide); polyethylene such as high density polyethylene, medium density polyethylene, low density polyethylene (LDPE), very low density polyethylene (in particular, a high-pressure process high density polyethylene, a high-pressure process low density polyethylene, linear low density polyethylene, and the like); a polypropylene-based resin; polymethyl pentene, and the like; it is preferable that at least one or more thereof be selected. Furthermore, it is more preferable to contain as the resin component, a polyolefin-based resin such as polyethylene and polypropylene. Examples of the polyolefin-based resin can include resins similar to those mentioned above.

The base material layer 2 may further include an antistatic agent. When the base material layer 2 further includes an antistatic agent, when it is used as a cover tape, dust and the like can be prevented from attaching to the product.

Examples of the antistatic agent contained in the base material layer 2 include the above-mentioned ionomer resin and the above-mentioned polyether copolymer. The preferable form of the ionomer resin and the polyether copolymer are similar to those mentioned above.

Furthermore, when the base material layer 2 contains an ionomer resin or a polyether copolymer, the content thereof is preferably 5 to 40% by mass, more preferably 10 to 30% by mass, and furthermore preferably 15 to 30% by mass with respect to the whose amount of the base material layer 2.

The base material layer 2 may include arbitrary additives such as various electrically conductive materials, a lubricant, a plasticizer, an antioxidant, an ultraviolet absorber, a colorant, various surfactants, an anti-blocking agent, and inorganic filler as long as the property is not damaged. Furthermore, the base material layer 2 may be subjected to coating treatment. Note that examples and preferable forms of the anti-blocking agent are the same as mentioned above.

The thickness of the base material layer 2 is preferably 5 to 60% and more preferably 10 to 50% with respect to the thickness of the entire cover tape 10. By appropriately changing the thickness of the base material layer 2, the rigidity of the cover tape can be adjusted. When the thickness of the base material layer 2 is in the above-mentioned range, suitable rigidity as a cover tape used in the taping reel method is obtained.

[Intermediate Layer 3]

The intermediate layer 3 is disposed between the base material layer 2 and the seal layer 1, and for example functions as a cushion layer for uniformly dispersing pressurization during thermal pressurization using heat sealing iron. When pressurization is dispersed uniformly, the heat sealed cover tape is adhesively bonded to the carrier tape with uniform adhesive strength. Note that the intermediate layer 3 may be a single-layer structure or may be a multi-layer structure.

The intermediate layer 3 may contain a thermoplastic elastomer to uniformly disperse pressurization during thermal pressurization using heat sealing iron. As the thermoplastic elastomer, olefin based elastomers such as copolymers of conjugated diene and a vinyl aromatic compound, for example, styrene-butadiene copolymer; copolymers in which an unsaturated moiety derived from the conjugated diene of the copolymer is hydrogenated; a styrene-isoprene block copolymer (SIS); styrene-ethylene-butadiene copolymer; styrene-ethylene-butylene copolymer; and ethylene-propylene copolymer can be preferably used.

It is preferable that the intermediate layer 3 be composed of a resin composition containing a polyolefin-based resin. Examples of the polyolefin-based resin include resins similar to those mentioned above.

Furthermore, it is preferable that the resin composition constituting the intermediate layer 3 contain a polypropylene based resin. With such an intermediate layer, heat resistance is improved. Furthermore, when the intermediate layer contains a polypropylene-based resin, the temperature at which cover tape shrinks is shifted to a higher temperature side, the setting temperature of the heat sealing iron can be made to be higher temperature, and thus sealing temperature conditions that enable stable heat sealing can be set widely.

Examples of the polypropylene-based resin can include resins similar to those mentioned above. In addition, for example a homopolymer, which is a single polymer of propylene; a random copolymer obtained by copolymerization with olefin such as ethylene and butene; a block copolymer of ethylene-propylene rubber and propylene; high-melt strength PP in which melt-tensile strength is improved by introducing branching therein; and reactor TPO; and the like can be used.

Furthermore, the above-mentioned resin composition may further include a resin component selected from an ethylene-vinyl acetate copolymer, an ethylene-aliphatic unsaturated carboxylic acid copolymer, an ethylene-aliphatic unsaturated carboxylic acid ester copolymer, a polyolefin-based resin, and a mixture thereof. Examples thereof include components similar to those mentioned above.

Furthermore, the above-mentioned resin composition may further include a polyolefin based acid-modified product. The polyolefin based acid-modified product refers to as a product prepared by acid modifying a polyolefin-based resin such as polyethylene and polypropylene with unsaturated carboxylic acid such as maleic acid and fumaric acid or an acid anhydride thereof. When such a polyolefin based acid-modified product is contained, adhesiveness between the intermediate layer 3 and the base material layer 2 and adhesiveness between the intermediate layer 3 and the seal layer 1 is furthermore improved.

The gel fraction of the resin composition is preferably 5 to 80% by mass, more preferably 7 to 68% by mass, and furthermore preferably 10 to 65% by mass. When the gel fraction of the resin composition is 80% by mass or less, pressurization can be dispersed in the intermediate layer 3 more uniformly, and the peeling strength between the cover tape and the carrier tape is furthermore stabilized. Furthermore, when the gel fraction of the resin composition is 5% by mass or more, the floating of the intermediate layer by pressurization during heat sealing is suppressed sufficiently, and therefore, the occurrence of floating-up in the end portions in the transverse direction of the cover tape can be further suppressed.

The gel fraction of the resin composition can be appropriately adjusted by a method of carrying out cross-linking treatment by, for example, irradiating the resin composition with ionizing radiation such as ultraviolet rays, electron beams, X rays, and y rays. Furthermore, the gel fraction may be adjusted by adding ultrahigh molecular weight polyethylene components having a molecular weight of more than one million.

Herein, the "gel fraction" refers to a value measured by the following method. That is to say, the initial mass of a sample to be measured is measured, the sample is placed in 150-mesh stainless wire net, and then immersed in a boiling paraxylene for 12 hours, an insoluble content is extracted, and a mass of the dried insoluble content is measured. Then, a value calculated by the following formula is defined as the "gel fraction."

Gel fraction(% by mass)=(Mass of insoluble content/ Initial mass of sample to be measured)×100

When the intermediate layer 3 has a multi-layer structure, it is preferable that at least one layer of the layers constituting the intermediate layer be a layer composed of a resin composition containing a polyolefin-based resin. Examples of such an intermediate layer include a two-layer structured intermediate layer consisting of a first layer composed of a resin composition containing a polyolefin-based resin and a second layer composed of a resin composition without containing a polyolefin-based resin. Furthermore, the intermediate layer 3 may be a two-layer structured intermediate layer consisting of a first layer composed of a first resin composition containing a polyolefin-based resin and a second layer composed of a second resin composition containing a polyolefin-based resin.

When the intermediate layer 3 has a multi-layer structure, it is preferable that the gel fractions of the resin compositions constituting the layers be each in the above-mentioned range. Furthermore, it is more preferable that the gel fraction of a test sample in which an equal amount of a resin composition constituting each layer is mixed be in the above-mentioned range.

The intermediate layer 3 may include arbitrary additives such as various electrically conductive materials, a lubricant, a plasticizer, an antioxidant, an ultraviolet absorber, a colorant, various surfactants, an anti-blocking agent, and inorganic filler as long as the property is not damaged. Furthermore, the intermediate layer 3 may be subjected to coating treatment. Note that examples and preferable forms of the anti-blocking agent are the same as mentioned above.

The thickness of the intermediate layer 3 is preferably 30 to 80% and more preferably 40 to 70% with respect to the thickness of the entire cover tape 10. When the thickness of the intermediate layer 3 is in the above-mentioned range, pressurization can be more uniformly dispersed in thermal pressurization during heat sealing.

[Other Layers]

Examples of a layer other than the seal layer 1, the base material layer 2 and the intermediate layer 3 include a vapor barrier layer of a barrier resin such as PVDC (polyvinylidene chloride). This layer may include arbitrary additives such as various electrically conductive materials, a lubricant, a plasticizer, an antioxidant, an ultraviolet absorber, a colorant, various surfactants, an anti-blocking agent, and an inorganic filler as long as the property is not damaged. Furthermore, this layer may be subjected to coating treatment. Note that examples and preferable forms of the anti-blocking agent are the same as mentioned above.

Next, one preferable embodiment of a method for manufacturing the cover tape 10 is described in detail.

[Method for Manufacturing Cover Tape 10]

A method for manufacturing a cover tape according to the embodiment includes a step of heat stretching a laminated body in at least one direction of MD and TD in which the laminated body includes at least a first layer composed of a resin composition constituting a base material layer 2, and a second layer composed of a resin composition constituting an intermediate layer 3. Through the step, the first layer and the second layer become the base material layer 2 and the intermediate layer 3, respectively.

The seal layer 1 can be formed by treating the surface of the second layer (that is to say, the intermediate layer) of the laminated body that has been heat stretched in the above-mentioned step by surface treatment such as corona treatment, ozone treatment, and flame treatment, and then applying a resin composition constituting the seal layer 1 onto the surface on which surface treatment has been carried out. Furthermore, it is preferable that the above-mentioned laminated body further include a third layer composed of a resin composition that constitutes the seal layer 1 and that the seal layer 1 can be produced by heat stretching together with the base material layer and the intermediate layer in the above-mentioned step.

The above-mentioned laminated body (hereinafter, sometimes referred to as "unstretched original fabric") can be manufactured by a method for forming a laminated body by, for example, coating or extrusion lamination, or coextrusion. Hereinafter, a multilayer coextrusion method will be described.

In the multilayer coextrusion method, the laminated body can be obtained by melt-extruding each of resin compositions constituting, for example, a first layer, a second layer, a third layer and other layers if necessary by a single extruder, laminating it in a multilayer die, melt-coextruding it, and quenching it.

Herein, the method of melt-coextrusion is not particularly limited, and, for example, the method may include a method using a multilayer T die or a multilayer circular die (annular die). Among them, a method using a multilayer circular die is preferable. Use of a multilayer circular die is advantageous in terms of necessary space for equipment and invested money amount, is suitable for production of small amount of various kinds of products, and enables heat shrinkage property to be more easily obtained.

Next, the melt-coextruded resin is quenched. As a refrigerant used for quenching, in general, water of 60° C. or less is preferably used. The refrigerant can be brought into direct contact with the molten resin, or indirectly used as an internal refrigerant inside a metal roll. When it is used as an internal refrigerant, in addition to water, known refrigerants such as oil can be used; in some cases, it can be used in combination with blowing of cool air.

The thus obtained laminated body is stretched, for example, 1.5 times or more in MD and 3 times or more in TD by heating to a temperature that is not lower than the softening temperature of the resin constituting the laminated body. The cover tape prepared by stretching in this way has the above-mentioned predetermined heat shrinkage rate. The stretching scale factor is appropriately selected according to the purposes, and the heat shrinkage rate of a film may be adjusted by carrying out heat treatment (heat relaxing treatment) after stretching if necessary.

Examples of the stretching method also include a direct inflation method of carrying out stretching by allowing air or nitrogen to blow in a tube immediately after it has been melt extruded; even with this method, a film having a heat shrinkage rate can be obtained. However, in order to express a high heat shrinkage rate, a biaxially stretching method is preferable; a tubular method (sometimes referred to as a double bubble method) in which the unstretched original fabric obtained in the above-mentioned circular die is heat stretched biaxially is more preferable. That is to say, the cover tape of this embodiment is preferably a biaxially stretched multilayer film that is manufactured by a tubular method for carrying out biaxial stretching.

A method for manufacturing a cover tape in this embodiment may include a cross-linking step of cross-linking treating resin before and after stretching. When cross-linking treatment is carried out, the cross-linking treatment is more preferably carried out by irradiation with energy rays before heat stretching the resin. Thus, melt-tensile strength of the laminated body in heat stretching is increased, and the stretching can be more stabilized. Note that a laminated body after stretching may be irradiated with energy rays to cross-linking treat resin. Examples of the energy rays to be used include ionizing radiation such as an ultraviolet ray, an electron beam, an X ray, and a γ ray. Among them, an electron beam is preferable.

Herein, it is preferable that the electron beam be used in the irradiation dose range of 10 to 300 KGy. From the viewpoint of adding stretching stability to the laminated body or adding heat resistance to the cover tape and the like, the irradiation dose is more preferably 50 kGy or more, and further preferably 80 kGy or more. From the viewpoint of adding low-temperature sealing property, the irradiation dose is preferably 280 kGy or less, and more preferably 250 kGy or less.

A layer to be cross-linking treated may be selected arbitrarily according to the purposes. Furthermore, for example, the vicinity of the surface of each layer may be mainly cross-linked. In this case, a method of irradiation while adjusting an acceleration voltage according to the thickness of the stretched original fabric and thereby adjusting the irradiation amount distribution in the thickness direction, a mask irradiation method of similarly adjusting the irradiation amount distribution using a shielding plate of, for example, aluminum, a method of irradiating with an electron beam from oblique direction to the surface of the stretched original fabric, and the like can be used.

When cross-linking treatment is carried out, arbitrary cross-linking inhibitors, cross-linking auxiliary agents (cross-linking promoters) may be added in each layer containing resin to be cross-linked. Examples of the cross-linking auxiliary agent include triallyl isocyanurate, trimethallyl isocyanurate, trimethyl propane triacrylate, triallyl cyanurate, and trimethallyl cyanurate.

When the resin composition constituting the base material layer contains a polyolefin-based resin, it is preferable that the cross-linking step be carried out because the heat resistance is added by cross-linking the resin composition constituting the base material layer and when the resin composition is brought into contact with the heat sealing iron, it is not easily welded to the heat sealing iron.

With such a manufacturing method, a cove tape having the above-mentioned predetermined heat shrinkage rate can be easily manufactured.

It is preferable that the cover tape according to this embodiment be a biaxially stretched film prepared by biaxially stretching in which a temperature at the stretching starting point is not lower than a melting peak temperature of the resin that constitutes the cover tape. The stretching scale factor in the case of a biaxially stretched film is preferably 1.5 time or more in MD and 3 times or more in TD from the viewpoint of suppression of inconsistency of the film thickness, and the factor is more preferably 1.8 time or more in MD and 4 times or more in TD, and furthermore preferably 2 time or more in MD and 5 times or more in TD. Note that the stretching starting point refers to a position at which stretching in TD starts, and the temperature at the stretching starting point refers to a surface temperature of the laminated body in the position.

Furthermore, the melting peak temperature is determined by measurement by the following method by using a differential scanning calorimeter (DSC). Measurement is carried out in which an amount of sample is 5 to 10 mg, measurement atmosphere is nitrogen atmosphere, and indium is used as a calorie reference. In the heating program, firstly, a temperature of the sample is raised from 0° C. to 300° C. at a heat-rising rate of 10° C./min (1st. melting behavior), the sample is stood still at 300° C. for 1 min, then the sample is cooled from 300° C. to 0° C. at a temperature-fall rate of 10° C./min, and the sample is stood still at 0° C. for 1 min (1st crystallization behavior). Thereafter, the temperature is raised from 0° C. to 300° C. at a heat-rising rate of 10° C./min (2nd melting behavior). The melting peak temperature is determined as a temperature showing an endothermic peak at the highest temperature side in the specific-heat curve obtained from the above-mentioned 2nd melting behavior.

The cover tape according to this embodiment is biaxially stretched in which a temperature at a stretching starting point is a temperature higher than melting peak temperature of a resin constituting the cover tape by not higher than 5° C., preferably not higher than 7° C., and more preferably not higher than 10° C. By setting the temperature at a stretching starting point as mentioned above, a cover tape having a temperature $T_1$ and a temperature $T_2$ satisfying the above-mentioned formulae (i), (ii) and (iii) is obtained.

As mentioned above, a preferable embodiment of the present invention has been described, but the present invention is not limited to the above-mentioned embodiment. For example, the above-mentioned embodiment provides a cover tape including a base material layer, an intermediate layer and a seal layer, but the cover tape according to the present invention is not limited to a structure including all of these three layers, but may have a single-layer structure or a double-layer structure. Such cover tapes can be manufactured by, for example, heat stretching a resin film composed of a resin composition constituting the cover tape as mentioned above.

EXAMPLES

Hereinafter, the embodiment will be described more specifically with reference to the following Examples and Comparative Examples, but the present embodiment is not limited to the Examples. Note that evaluation methods and measuring methods to be used in this embodiment are as follows.

(1) Gel Fraction

In 1000 ml of boiling paraxylene, 100 mg of sample placed in 150-mesh stainless wire net was subjected to extraction for 12 hours, and the rate of the insoluble content was expressed by the following formula; the rate was defined as a gel fraction, and the gel fraction was used as a scale of the degree of cross-linkage of resin in the film. For the gel fraction in the intermediate layer (B), the base material layer (A) and the seal layer (C) were removed from the cover tape and the remaining portion was used as a sample for measurement.

Gel fraction(% by mass)=(Mass of insoluble content/Mass of sample before extraction)×100

(2) Heat Shrinkage Rate

A cover tape sample of 100 mm×100 min was placed in an air oven thermostat set at a predetermined temperature, and the sample was heat treated for 10 min in a state in which the sample freely shrinks; then, the distance between the center portions of the opposite sides are measured to obtain a shrinkage amount of the film; the obtained shrinkage amount of the film is divided by the original dimension (distance between the center portions of the opposite sides before heat treatment) to calculate the percentage, based on which the arithmetic mean value of twice measurement results of the shrinkage rates in each of MD and TD was calculated. Note that the measurement was carried out at temperature interval of 20° C. in the temperature range from 80 to 200° C.

(3) Production of Taping Sample

By using Semiautomatic Taping Equipment PTS-180 manufactured by PALMEC CO, LTD., in the conditions of seal head width: 0.5 mm×2, seal head length: 24 mm, the distance between the center portions of seal head: 7.5 mm, seal pressure: 0.4 MPa, feeding length: 8 mm, and sealing time: 0.3 sec×2 (double seal), heat sealing was carried out to 12 mm-width PS emboss carrier tape (Sumicarrier, manufactured by Sumitomo Bakelite Co., LTD.) by using a cover tape slit in 9.5 mm width while the heat sealing temperature was adjusted in the temperature range of 100° C. to 200° C., in the temperature interval of 10° C.; a taping sample was produced for each temperature.

(4) Evaluation of Twist of Cover Tape

In the taping sample produced in (3), displacement of the cover tape in a state in which it is heat sealed to the PS emboss carrier tape was measured by using laser microscope (LEXTOLS4000) manufactured by Olympus Corporation.

More preferably, the difference in the displacement in the cover tape between MD and TD is 50 μm or less and the cover tape is free from slack; next preferably, the difference in the displacement in the cover tape between MD and TD is more than 50 μm and 100 μm or less, and the cover tape has a little slack; when the difference in the displacement in the cover tape between MD and is more than 100 μm and remarkable slack is included in the cover tape, it cannot be said that the cover tape is suitable.

(5) Heat Seal Lower Limit Temperature

The taping sample produced in the above (3) was evaluated for twist of the cover tape by the method mentioned in the above (4), a minimum heat seal setting temperature of the sample at which the difference in the displacement in the cover tape was 100 μm or less was defined as a heat seal lower limit temperature.

(6) Heat Seal Upper Limit Temperature

In a taping sample produced in the above (3), when a non-sealed portion of both end portions of the cover tape (a portion with which the seal head of the heat sealing iron is not brought into contact) was visually observed, a sample in which a width of a non-sealed portion is 0.3 mm or more and 0.5 mm or less was evaluated as "A" and a sample in which a width of a non-sealed portion is less than 0.3 m was evaluated as "B." Note that since a taping sample has a width of 9.5 mm, a seal head width of 0.5 mm, and a distance between two seal heads (distance between the center portions of the seal head) of 7.5 mm, the non-sealed portion of both end portions is 0.5 mm in width at the maximum.

The maximum setting temperature of the heat sealing temperature at which a sample was evaluated as "A" in this evaluation was defined as the heat seal upper limit temperature.

(7) Peeling Strength

In a taping sample heat sealed at the heat seal upper limit temperature in the evaluation described above (6) among the taping samples produced in the above (3), the cover tape was peeled off when one hour had passed after taping and the peeling strength was measured by using a peeling strength tester PFT-50S manufactured by PALMEC CO, LTD. in the conditions of the peeling rate=300 mm/min and peeling angle=170°. The same measurement was carried out three times in total, and the peeling strength was evaluated from the arithmetic mean values.

(8) Surface Intrinsic Resistance

By using SUPER MEGOHM MEIER SM-8220 (HIOKI E.E. CORPORATION), according to the resistivity measuring method described in JIS K6911, the surface intrinsic resistance of a seal layer of each cover tape was measured. The measurement was carried out at a temperature of 23° C. and humidity of 50%.

Resin used in Examples and Comparative Examples are as follows.

<Base Material Layer>

Ny1: aliphatic polyamide (NOVAMID2430A manufactured by Mitsubishi Chemical Corporation)

Ny2: aromatic polyamide (X21-F07 manufactured by Mitsubishi Chemical Corporation)

HD1: high density polyethylene (SUNTEC HD J240 manufactured by ASAHI KASEI CHEMICALS CORPORATION, melt flow rate=5.5 g/10 min, density=0.966 g/cm$^3$)

LD1: high-pressure process low density polyethylene (SUNTEC LDM2102 manufactured by ASAHI KASEI CHEMICALS CORPORATION, melt flow rate=0.2 g/10 min, density=0.921 g/cm$^3$)

Polymeric electrically conductive agent 1: polyether-polyolefin copolymer (Pelestat VH230 manufactured by Sanyo Chemical Industries, Ltd.)

Polymeric electrically conductive agent 2: polyether-polyolefin copolymer (SANKONOL TBX25 manufactured by Sanko Chemical Industry Co., Ltd.)

TPO: reactor TPO (PRIME TPO E-2900H manufactured by Prime Polymer Co., Ltd., melt flow rate=2.5 g/10 min)

PP: polypropylene (NOVATEC EA9 manufactured by Japan Polypropylene Corporation, melt flow rate=0.5 g/10 min, density=0.900 g/cm$^3$)

O-PET: corona-treated biaxially stretched polyethylene terephthalate film (thickness: 15 μm)

<Intermediate Layer> r-PP: Propylene based copolymer (ADSYL 5C30F. manufactured by Montell, melt flow rate=5.5 g/10 min, density=0.921 g/cm$^3$)

LD1: High-pressure process low density polyethylene (SUNTEC LDM2102 manufactured by ASAHI KASEI CHEMICALS CORPORATION, melt flow rate=0.2 g/10 min, density=0.921 g/cm$^3$)

LD2: High-pressure process low density polyethylene (UBE polyethylene B028 manufactured by UBE-MARUZEN POLYETHYLENE, melt flow rate=0.4 g/10 min, density=0.927 g/cm$^3$)

AD1: maleic anhydride modified polyethylene (ADMER NF308 manufactured by MITSUI CHEMICALS, INC., melt flow rate: 1.7 g/10 min, density: 0.932 g/cm$^3$)

LL1: ethylene-α-olefin random copolymer (dowlex2032 manufactured by Dow Chemical Japan Ltd., which is polymerized by using a multi-site catalyst, α-olefin: 1-octene, melt flow rate: 2.0 g/10 min, density: 0.926 g/cm$^3$)

HD2: high density polyethylene (SUNTEC HD B871 manufactured by ASAHI KASEI CHEMICALS CORPORATION, melt flow rate=5.5 g/10 min, density=0.966 g/cm$^3$)

PP: polypropylene (NOVATEC EA9 manufactured by Japan Polypropylene Corporation, melt flow rate=0.5 g/10 min, density=0.900 g/cm$^3$)

TPO: reactor TPO (PRIME TPO E-2900H manufactured by Prime Polymer Co., Ltd., melt flow rate=2.5 g/10 min)

TPX: polymethyl pentene (TPX MX004 manufacture by MITSUI CHEMICALS, INC., melt flow rate=25 g/10 min, density=0.834 g/cm$^3$)

PB1: polybutene (BEAULON BL4000 manufactured by MITSUI CHEMICALS, INC., melt flow rate=1.8 g/10 min, density=0.915 g/cm$^3$)

APL: cyclic olefin (APEL APL6509 manufactured by MITSUI CHEMICALS, INC., melt flow rate=30 g/10 min, density=1.02 g/cm$^3$)

EBC: ethylene-butene 1 copolymer (TAFMER A4085 manufactured by MITSUI CHEMICALS, INC., melt flow rate=3.6 g/10 min, density=0.88 g/cm$^3$)

SEBC: styrene-ethylene-butylene copolymer (Tuftec H1221 manufactured by ASAHI KASEI CHEMICALS CORPORATION, melt flow rate=4.5 g/10 min)

tackifier 3: hydrogenated petroleum resin (ARKON P90 manufactured by Arakawa Chemical Industries, Ltd.)

<Seal Layer>

EVA: ethylene vinyl acetate copolymer (NUC3461 manufactured by Nippon Unicar Company Limited, vinyl acetate content=20% by mass, melt flow rate=14 g/10 min, density=0.940 g/cm$^3$)

LL2: ethylene-α-olefin random copolymer (Umerit 0540F manufactured by UBE-MARUZEN POLYETHYLENE, melt flow rate=4.0 g/10 min, density=0.904 g/cm$^3$)

VMX: polyolefin-based polymer alloy (VMX Z100F manufactured by Mitsubishi Chemical Corporation, melt flow rate=14 g/10 min, density=0.910 g/cm$^3$)

VL: Linear very low density polyethylene (Affinity 8200 manufactured by Dow Chemical Japan Ltd., melt flow rate=4.0 g/10 min, density=0.870 g/cm$^3$)

Tackifier 1: hydrogenated petroleum resin (ARKON P125 manufactured by Arakawa Chemical Industries, Ltd.)

Tackifier 2: hydrogenated petroleum resin (ARKON P115 manufactured by Arakawa Chemical Industries, Ltd.)

Tackifier 3: hydrogenated petroleum resin (ARKON P90 manufactured by Arakawa Chemical Industries, Ltd.)

Polymeric electrically conductive agent 2: polyether-polyolefin copolymer, lithium salt containing compound (TBX-25 manufactured by Sanko Chemical Industry Co., Ltd.)

EVA emulsion: emulsion containing an electrically conductive agent mainly composed of EVA (manufactured by Chuo Rika Kogyo K.K.)

PE emulsion: emulsion containing an electrically conductive agent mainly composed of PE (manufactured by Chuo Rika Kogyo K.K.)

Example 1

For a base material layer (A), 70% by mass of Ny1, 20% by mass of Ny2 and 10% by mass of polymeric electrically conductive agent 1 were used; for a first intermediate layer (B1), AD1 was used; for a second intermediate layer (B2), 70% by mass of r-PP and 30% by mass of LD1 were used; for a seal layer (C), 60% by mass of EVA, 20% by mass of tackifies 1, and 20% by mass of polymeric electrically conductive agent 2 were used, respectively; these layers were coextruded by using a three-layered annular die in a state in which the seal layer (C) was disposed at the outer side so that the layer arrangement was A/B1/B2/C and that the thickness ratio (%) of each layer was 30/5/55/10, followed by quenching and solidifying in cold water to obtain a tubular unstretched original fabric having a folding width of 130 mm, a thickness of about 650 μm and uniform thickness precision in each layer.

This unstretched original fabric was fed through two pairs of differential nip rolls while it was heated in a stretching machine, and stretched three times in MD and 4.3 times (13 times for the area stretching scale factor) in TD by infusing air to obtain a 50 μm-thick cover tape. Evaluation results of the obtained cover tape are shown in Table 1. Note that the heat shrinkage rates at 60° C. of the obtained cover tape were 3% and 3% in MD and TD, respectively.

Example 2

A 50 μm-thick cover tape was obtained in the same manner as in Example 1 except that the tubular unstretched original fabric was irradiated with electron beams (acceleration voltage=1 MV, irradiation dose=120 kGy). The evaluation results of the obtained cover tape are shown in Table 1. Note that the heat shrinkage rates at 60° C. of the obtained cover tape were 3% and 2% in MD and TD, respectively.

Example 3

For the base material layer (A), 90% by mass of HD1, 10% by mass of polymeric electrically conductive agent 1 were used; for the intermediate layer (B), 65% by mass of LL1 and 35% by mass of LD1 were used; for the seal layer (C), 60% by mass of EVA, 20% by mass of tackifier 1, and 20% by mass of polymeric electrically conductive agent 2 were used, respectively; these layers were coextruded by using a three-layered annular die in a state in which the seal layer (C) was disposed at the outer side so that the layer arrangement was A/B/C and that the thickness ratio (%) of each layer was 30/60/10, followed by quenching and solidifying in cold water to obtain a tubular unstretched original fabric having a folding width of 130 mm, a thickness of about 650 μm and uniform thickness precision in each layer. A 50 μm-thick cover tape was obtained in the same manner as in Example 1 except that the unstretched original fabric was irradiated with electron beams (acceleration voltage=1 MV, irradiation dose=120 kGy). The evaluation results of the obtained cover tape are shown in Table 1.

Example 4

A 50 μm-thick cover tape was obtained in the same manner as in Example 3 except that the irradiation dose in the electron beam irradiation was 180 kGy. The evaluation results of the obtained tape are shown in Table 1.

Examples 5 to 9

A 50 μm-thick cover tape was obtained in the same manner as in Example 3 except that the composition of each layer was changed to the compositions shown in Tables 1 and 2. The evaluation results of the obtained tape are shown in Tables 1 and 2.

Example 10

For the base material layer (A), 90% by mass of HD1 and 10% by mass of polymeric electrically conductive agent 1 were used; for the intermediate layer (B), 60% by mass of LD1 and 40% by mass of PP were used; these layers were coextruded by using a two-layered annular die in a state in which the intermediate layer (B) was disposed at the outer side so that the layer arrangement was A/B, followed by quenching and solidifying in cold water to obtain a tubular unstretched original fabric having a folding width of 130 mm, a thickness of about 580 μm and uniform thickness precision in each layer. A 45 μm-thick tape was obtained in the same manner as in Example 1 except that the unstretched original fabric was irradiated with electron beams (acceleration voltage=1 MV, irradiation dose=120 kGy). The surface of the obtained intermediate layer (B) was subjected to corona treatment, then EVA emulsion was applied as the seal layer (C) to a dried thickness of 5 μm to obtain a cover tape having a layer ratio (%) of 30/60/10 and a thickness of 50 μm. The evaluation results of the obtained cover tape are shown in Table 2.

Example 11

A 50 μm-thick cover tape was obtained in the same manner as in Example 10 except that PE emulsion was used for the seal layer (C). The evaluation results of the obtained cover tape are shown in Table 2.

Example 12

A 50 μm-thick cover tape was obtained in the same manner as in Example 11 except that the thickness ratio (%) of each layer of base material layer (A)/intermediate layer (B)/seal layer (C) was changed to a thickness ratio (%) of 45/45/10. The evaluation results of the obtained cover tape are shown in Table 2.

Example 13

For the base material layer (A), 90% by mass of HD1 and 10% by mass of polymeric electrically conductive agent 1 were used; for the intermediate layer (B), 60% by mass of LD2 and 40% by mass of TPO were used; these layers were coextruded by using a two-layered annular die in a state in which the intermediate layer (B) was disposed at the outer side so that the layer arrangement was A/B, followed by quenching and solidifying in cold water to obtain a tubular unstretched original fabric having a folding width of 130 mm, a thickness of about 580 μm and uniform thickness precision in each layer. A 45 μm-thick tape was obtained in the same manner as in Example 1 except that the unstretched original fabric was irradiated with electron beams (acceleration voltage=1 MV, irradiation dose=120 kGy). The surface of the obtained intermediate layer (B) was subjected to corona treatment, then EVA emulsion was applied as the seal layer (C) to a dried thickness of 5 μm to obtain a cover tape having a layer ratio (%) of 15/75/10 and a thickness of 50 μm. The evaluation results of the obtained cover tape are shown in Table 2.

Examples 14 to 21

A 50 μm-thick cover tape was obtained in the same manner as in Example 13 except that the composition of each layer was changed to the compositions shown in Tables 2 and 3. The evaluation results of the obtained tape are shown in Tables 2 and 3.

Comparative Example 1

For a base material layer (A), 70% by mass of Ny1, 20% by mass of Ny2 and 10% by mass of polymeric electrically conductive agent 1 were used; for an intermediate layer (B1), AD1 was used; for an intermediate layer (B2), 70% by mass of r-PP and 30% by mass of LDPE were used; for a seal layer (C), 60% by mass of EVA, 20% by mass of tackifier resin, and 20% by mass of polymeric electrically conductive agent 2 were used, respectively; these layers were coextruded by using a three-layered annular die in a state in which the seal layer (C) was disposed at the outer side so that the layer arrangement was A/B1/B2/C and that the thickness ratio (%) of each layer was 30/5/55/10, followed by quenching and solidifying in cold water to obtain a tubular unstretched cover tape having a folding width of 130 mm, a thickness of about 50 μm and uniform thickness precision in each layer. Evaluation results of the obtained cover tape are shown in Table 3. Note that twist of the cover tape and the peeling strength were evaluated using a taping sample that had been heat sealed at 160° C.

Comparative Example 2

For the intermediate layer (B2), 65% by mass of LLDPE and 35% by mass of LDPE were used; for a seal layer (C), 60% by mass of EVA, 20% by mass of tackifier resin, and 20% by mass of polymeric electrically conductive agent 2 were used, respectively; these layers were coextruded by using an annular die in a state in which the seal layer (C) was disposed at the outer side, followed by quenching and solidifying in cold water to obtain a tubular unstretched original fabric having a folding width of 130 mm and a thickness of about 410 µm; this unstretched original fabric was irradiated with electron beams (acceleration voltage=1 MV, irradiation dose=120 kGy), and then was fed through two pairs of differential nip rolls while it was heated in a stretching machine, and stretched three times in MD and 4.2 times (13 times for the area stretching scale factor) in TD by infusing air to obtain an intermediate layer (B2)/seal layer (C) laminated film having a thickness of 33 µm.

For the base material layer (A), a biaxially stretched polyethylene terephthalate film having a thickness of 15 µm was used; as the intermediate layer (B1), a urethane-based anchor coat agent was applied onto one side surface of O-PET to a dried thickness of 2 µm, and the intermediate layer (B2)/seal layer (C) laminated film was laminated by dry laminate to obtain a cover tape having a layer ratio (%) of base material layer (A)/intermediate layer (B1)/intermediate layer (B2)/seal layer (C) of 30/5/55/10 and having a thickness of 50 µm. The evaluation results of the obtained cover tape are shown in Table 3. Note that twist of the cover tape and the peeling strength were evaluated using a taping sample that had been heat sealed at 160° C.

Comparative Example 3

A composition composed of 65% by mass of LLDPE and 35% by mass of LDPE was extruded by using an annular die, followed by quenching and solidifying in cold water to obtain a tubular unstretched original fabric having a folding width of 130 mm, a thickness of about 350 µm. This unstretched original fabric was irradiated with electron beams (acceleration voltage=1 MV, irradiation dose=120 kGy), and then was fed through two pairs of differential nip rolls while it was heated in a stretching machine, and stretched three times in MD and 4.2 times (13 times for the area stretching scale factor) in TD by infusing air to obtain a thickness of 28 µm film. Both surfaces of the obtained film were subjected to corona treatment, and the treated film was used as the intermediate layer (B2). Note that twist of the cover tape and the peeling strength were evaluated using a taping sample that had been heat sealed at 160° C.

For the base material layer (A), a biaxially stretched polyethylene terephthalate film having a thickness of 15 µm was used; as the intermediate layer (B1), a urethane-based anchor coat agent was applied onto one side surface of O-PET to a dried thickness of 2 µm, and the intermediate layer (B2) film was laminated by dry laminate.

As the seal layer (C), EVA emulsion was applied onto the surface of the intermediate layer (B) to a dried thickness of 5 µm to obtain a cover tape having a layer ratio (%) of 30/5/55/10 and having a thickness of 50 µm. The evaluation results of the obtained cover tape are shown in Table 3.

TABLE 1

| | | Example 1 | Example 2 | Example 3 | Example 4 | Example 5 | Example 6 | Example 7 | Example 8 |
|---|---|---|---|---|---|---|---|---|---|
| Layer configuration | Base material layer (A) (% by mass) | Ny1 + Ny2 + electrically conductive agent 1 (70/20/10) | Ny1 + Ny2 + electrically conductive agent 1 (70/20/10) | HD1 + electrically conductive agent 1 (90/10) | HD1 + electrically conductive agent 1 (90/10) | HD1 + LD1 + electrically conductive agent 2 (60/35/5) | HD1 + LD1 + electrically conductive agent 2 (80/15/5) | HD1 + LD1 + electrically conductive agent 1 (60/30/10) | HD1 + LD1 + electrically conductive agent 1 (80/10/10) |
| | Intermediate layer (B1) | AD1 | AD1 | — | — | — | — | — | — |
| | Intermediate layer (B2) (% by mass) | r-PP-LD1 (70/30) | r-PP-LD1 (70/30) | LL1 + LD1 (65/35) | LL1 + LD1 (65/35) | HD2 + LD1 (55/45) | HD2 + LD1 (50/50) | HD2 + LD1 (50/50) | HD2 + LD1 (50/50) |
| | Seal layer (C) (% by mass) | EVA + tackifier 1 + electrically conductive agent 2 (60/20/20) | EVA + tackifier 1 + electrically conductive agent 2 (60/20/20) | EVA + tackifier 1 + electrically conductive agent 2 (60/20/20) | EVA + tackifier 1 + electrically conductive agent 2 (60/20/20) | LL2 + tackifier 1 + electrically conductive agent 2 (60/20/20) | EVA + tackifier 1 + electrically conductive agent 2 (60/20/20) | VMX + tackifier 2 + electrically conductive agent 2 (60/20/20) | VL + tackifier 3 + electrically conductive agent 2 (60/20/20) |
| Layer ratio/% | | 30/5/55/10 | 30/5/55/10 | 30/60/10 | 30/60/10 | 30/60/10 | 30/65/5 | 30/60/10 | 30/60/10 |
| Tape thickness/µm | | 50 | 50 | 50 | 50 | 50 | 50 | 50 | 50 |
| Gel fraction of intermediate layer (B)/% by mass | | 0 | 13 | 21 | 45 | 36 | 36 | 37 | 36 |
| Modulus of elasticity/MPa | | 880 | 890 | 580 | 590 | 870 | 900 | 850 | 900 |
| Shrinkage rate/% MD/TD | 80° C. | 16/14 | 15/14 | 2/1 | 2/1 | 2/1 | 1/0 | | 2/1 |
| | 100° C. | 31/21 | 30/22 | 4/3 | 4/3 | 4/3 | 3/1 | 4/2 | 3/1 |
| | 120° C. | 33/23 | 33/24 | 12/17 | 12/17 | 10/8 | 8/7 | 10/9 | 8/7 |
| | 140° C. | 37/35 | 37/36 | 71/72 | 71/72 | 51/62 | 49/61 | 50/60 | 51/62 |
| | 160° C. | 40/38 | 40/38 | 72/74 | 72/74 | 60/69 | 61/67 | 62/66 | 60/69 |
| | 180° C. | 50/40 | 51/39 | 72/74 | 72/74 | 71/73 | 70/72 | 71/70 | 71/73 |
| | 200° C. | 52/47 | 54/48 | 72/74 | 72/74 | 72/74 | 71/73 | 73/72 | 72/74 |
| Twist of cover tape MD/TD/µm | | 79/89 | 76/72 | 20/33 | 19/31 | 24/33 | 27/35 | 27/35 | 27/34 |
| Surface intrinsic resistance/Ω | | $4.3 \times 10^8$ | $4.2 \times 10^8$ | $4.1 \times 10^8$ | $4.4 \times 10^8$ | $4.3 \times 10^8$ | $4.2 \times 10^8$ | $4.3 \times 10^8$ | $4.1 \times 10^8$ |
| Peeling strength/gf | | 56 | 53 | 53 | 52 | 28 | 49 | 37 | 42 |
| Seal lower limit temperature/° C. | | 140 | 140 | 100 | 100 | 100 | 100 | 100 | 100 |
| Seal upper limit temperature/° C. | | 160 | 160 | 140 | 140 | 140 | 140 | 140 | 140 |
| Seal temperature range/° C. | | 20 | 20 | 40 | 40 | 40 | 40 | 40 | 40 |

TABLE 2

| | | Example 9 | Example 10 | Example 11 | Example 12 | Example 13 | Example 14 | Example 15 | Example 16 |
|---|---|---|---|---|---|---|---|---|---|
| Layer configuration | Base material layer (A) (% by mass) | HD1 + electrically conductive agent 1 (90/10) | HD1 + electrically conductive agent 1 (90/10) | HD1 + electrically conductive agent 1 (90/10) | HD1 + electrically conductive agent 1 (90/10) | HD1 + electrically conductive agent 1 (90/10) | HD1 + electrically conductive agent 1 (90/10) | HD1 + electrically conductive agent 1 (90/10) | HD1 + electrically conductive agent 1 (90/10) |
| | Intermediate layer (B1) | | | | | | | | |
| | Intermediate layer (B2) (% by mass) | LD1 + PP (60/40) | LD1 + PP (60/40) | LD1 + PP (60/40) | LD1 + PP (60/40) | LD2 + TPO (60/40) | LD2 + TPX (80/20) | LD2 + PB1 (60/40) | LD2 + APL (60/40) |
| | Seal layer (C) (% by mass) | EVA + tackifier 1 + electrically conductive agent 2 (60/20/20) | EVA emulsion | PE emulsion | EVA emulsion | EVA emulsion | EVA emulsion | EVA emulsion | EVA emulsion |
| Layer ratio/% | | 30/60/10 | 30/60/10 | 30/60/10 | 45/45/10 | 15/75/10 | 15/75/10 | 15/75/10 | 15/75/10 |
| Tape thickness/μm | | 50 | 50 | 50 | 50 | 50 | 50 | 50 | 50 |
| Gel fraction of intermediate layer (B)/% by mass | | 33 | 34 | 36 | 35 | 40 | 40 | 38 | 35 |
| Modulus of elasticity/MPa | | 720 | 715 | 740 | 700 | 700 | 730 | 680 | 900 |
| Shrinkage rate/% MD/TD | 80° C. | 2/1 | 1/0 | 0/1 | 2/1 | 1/0 | 0/0 | 2/0 | 1/0 |
| | 100° C. | 4/3 | 3/2 | 1/2 | 3/3 | 2/0 | 1/0 | 5/4 | 2/1 |
| | 120° C. | 6/7 | 5/7 | 4/5 | 6/8 | 3/2 | 1/0 | 13/19 | 3/3 |
| | 140° C. | 31/44 | 32/39 | 30/37 | 33/45 | 47/50 | 28/28 | 70/71 | 45/47 |
| | 160° C. | 42/51 | 40/48 | 38/46 | 44/51 | 50/51 | 35/35 | 70/71 | 51/50 |
| | 180° C. | 58/60 | 55/60 | 54/58 | 59/60 | 60/60 | 40/41 | 70/71 | 58/59 |
| | 200° C. | 68/70 | 67/69 | 65/67 | 67/69 | 65/65 | 45/47 | 70/71 | 61/63 |
| Twist of cover tape MD/TD/μm | | 22/34 | 25/36 | 23/37 | 26/39 | 27/33 | 25/41 | 23/32 | 26/35 |
| Surface intrinsic resistance/Ω | | $4.3 \times 10^8$ | $4.2 \times 10^8$ | $4.3 \times 10^8$ | $4.1 \times 10^8$ | $4.4 \times 10^8$ | $4.6 \times 10^8$ | $4.7 \times 10^8$ | $4.3 \times 10^8$ |
| Peeling strength/gf | | 54 | 60 | 58 | 59 | 57 | 55 | 59 | 55 |
| Seal lower limit temperature/° C. | | 100 | 100 | 100 | 100 | 100 | 100 | 100 | 100 |
| Seal upper limit temperature/° C. | | 150 | 150 | 150 | 150 | 150 | 150 | 140 | 140 |
| Seal temperature range/° C. | | 50 | 50 | 50 | 50 | 50 | 50 | 40 | 40 |

TABLE 3

| | | Example 17 | Example 18 | Example 19 | Example 20 | Example 21 | Comparative Example 1 | Comparative Example 2 | Comparative Example 3 |
|---|---|---|---|---|---|---|---|---|---|
| Layer configuration | Base material layer (A) (% by mass) | HD1 + electrically conductive agent 1 (90/10) | HD1 + electrically conductive agent 1 (90/10) | HD1 + electrically conductive agent 1 (90/10) | HD1 + TPO + electrically conductive agent 1 (60/30/10) | PP + electrically conductive agent 1 (60/30/10) | Ny1 + Ny2 + electrically conductive agent 1 (70/20/10) | O-PET | O-PET |
| | Intermediate layer (B1) | | | | | | AD1 | Urethane-based coat | Urethane-based coat |
| | Intermediate layer (B2) (% by mass) | LD2 + TPO + EBC (40/50/10) | LD2 + TPO + SEBC (40/50/10) | LD2 + TPO + tackifier 3 (50/40/10) | LD2 + TPO + EBC (50/40/10) | LD2 + TPO + EBC (50/40/10) | r-PP + LD1 (70/30) | LL1 + LD1 (65/35) | LL1 + LD1 (65/35) |
| | Seal layer (C) (% by mass) | EVA emulsion | EVA emulsion | EVA emulsion | EVA emulsion | EVA emulsion | EVA + tackifier 1 + electrically conductive agent 2 (60/20/20) | EVA + tackifier 1 + electrically conductive agent 2 (60/20/20) | EVA emulsion |
| Layer ratio/% | | 15/75/10 | 15/75/10 | 15/75/10 | 15/75/10 | 15/75/10 | 30/60/10 | 30/5/55/10 | 30/5/55/10 |
| Tape thickness/μm | | 50 | 50 | 50 | 50 | 50 | 50 | 50 | 50 |
| Gel fraction of intermediate layer (B)/% by mass | | 41 | 40 | 38 | 38 | 37 | 0 | 20 | 23 |
| Modulus of elasticity/MPa | | 680 | 680 | 690 | 710 | 730 | 780 | 1270 | 1240 |
| Shrinkage rate/% MD/TD | 80° C. | 1/0 | 1/1 | 1/1 | 0/0 | 1/0 | 0/0 | 0/0 | 0/0 |
| | 100° C. | 2/0 | 2/4 | 2/1 | 1/0 | 1/0 | 0/0 | 0/0 | 0/0 |
| | 120° C. | 3/3 | 5/7 | 3/3 | 2/2 | 2/1 | 0/0 | 0/0 | 0/0 |
| | 140° C. | 48/51 | 51/54 | 47/51 | 47/48 | 45/45 | 0/0 | 0/0 | 0/0 |

TABLE 3-continued

|  | Example 17 | Example 18 | Example 19 | Example 20 | Example 21 | Comparative Example 1 | Comparative Example 2 | Comparative Example 3 |
|---|---|---|---|---|---|---|---|---|
| 160° C. | 58/58 | 61/61 | 50/54 | 48/49 | 48/47 | 0/0 | 0/0 | 0/0 |
| 180° C. | 60/60 | 65/65 | 58/59 | 59/60 | 60/60 | 1/0 | 0/0 | 0/0 |
| 200° C. | 61/62 | 69/68 | 64/67 | 65/65 | 65/64 | 3/1 | 1/2 | 2/2 |
| Twist of cover tape MD/TD/μm | 24/33 | 27/33 | 26/37 | 27/34 | 22/37 | 95/280 | 87/120 | 76/131 |
| Surface intrinsic resistance/Ω | $4.5 \times 10^8$ | $4.2 \times 10^8$ | $4.6 \times 10^8$ | $4.8 \times 10^8$ | $4.3 \times 10^8$ | $4.3 \times 10^8$ | $4.1 \times 10^8$ | $4.4 \times 10^8$ |
| Peeling strength/gf | 57 | 54 | 57 | 61 | 59 | 56 | 53 | 52 |
| Seal lower limit temperature/° C. | 100 | 100 | 100 | 100 | 100 | — | — | — |
| Seal upper limit temperature/° C. | 150 | 150 | 150 | 150 | 150 | | | |
| Seal temperature range/° C. | 50 | 50 | 50 | 50 | 50 | — | — | — |

From the results in Tables 1 to 3, the cover tapes obtained in Examples 1 to 21 have moderate heat shrinkage rates, and provide tight packaging free from slack in the cover tape immediately after heat sealing. On the other hand, from the results in Table 3, the cover tapes obtained in Comparative Examples 1 to 3 provide rough packaging that still has slack in the cover tape immediately after heat sealing.

Industrial Applicability

Use of a cover tape of the present invention enables tight packaging free from slack in the cover tape immediately after heat sealing; damage to an electronic part due to vibration during transport can be prevented, and the electronic part can be prevented from moving out from a carrier tape pocket.

Reference Signs List

1 . . . seal layer, 2 . . . base material layer, 3 . . . intermediate layer, 10 . . . cover seal, 11 . . . electronic part package, 20 . . . carrier tape, 21 . . . electronic part accommodating pocket, 30 . . . electronic part, 50 . . . heat sealing iron.

The invention claimed is:

1. A cover tape having a temperature at which heat shrinkage rates in both a machine direction and a transverse direction perpendicular to the machine direction are 5% or more between 80° C. to 200° C., wherein the cover tape has a temperature $T_1$ and a temperature $T_2$ satisfying following formulae (i),(ii),(iii), and (iv) in both the machine direction and the transverse direction:

$$0° C. < T_1 - T_2 \leq 60° C. \quad \text{(i)}$$

$$S_1 - S_2 \geq 25\% \quad \text{(ii)}$$

$$80° C. \leq T_1 \leq 200° C. \quad \text{(iii)}$$

$$60° C. \leq T_2 \quad \text{(iv)}$$

wherein $S_1$ denotes a heat shrinkage rate (%) at a temperature $T_1$, and $S_2$ denotes a heat shrinkage rate $S_2$ (%) at a temperature $T_2$, and wherein the cover tape comprises a base material layer composed of a resin composition containing a polyolefin-based resin; a seal layer constituting a surface for heat sealing; and an intermediate layer composed of a resin composition containing a polyolefin-based resin disposed between the base material layer and the seal layer.

2. The cover tape according to claim 1, wherein the base material layer, the seal layer and the intermediate layer are composed of a resin composition containing a polyolefin-based resin.

3. The cover tape according to claim 2, wherein a gel fraction of the resin composition constituting the intermediate layer is 5 to 80% by mass.

4. The cover tape according to claim 1, wherein a thickness of the seal layer is 0.5 to 15% with respect to a thickness of the cover tape.

5. The cover tape according to claim 1, wherein a surface intrinsic resistance value of the seal layer is $1 \times 10^4$ to $1 \times 10^{13}$ Ω.

6. A method for manufacturing a cover tape according to claim 1, the method comprising:

a step of heat stretching a laminated body including at least a first layer composed of a resin composition constituting the base material layer, and a second layer composed of a resin composition constituting the intermediate layer.

7. An electronic part package using a cover tape according to claim 1.

* * * * *